United States Patent
Manabe

(10) Patent No.: US 8,026,554 B2
(45) Date of Patent: Sep. 27, 2011

(54) SEMICONDUCTOR DEVICE AND MANUFACTURING METHOD THEREOF

(75) Inventor: Kenzo Manabe, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 130 days.

(21) Appl. No.: 12/279,379

(22) PCT Filed: Nov. 24, 2006

(86) PCT No.: PCT/JP2006/323437
§ 371 (c)(1),
(2), (4) Date: Aug. 14, 2008

(87) PCT Pub. No.: WO2007/094110
PCT Pub. Date: Aug. 23, 2007

(65) Prior Publication Data
US 2009/0026550 A1    Jan. 29, 2009

(30) Foreign Application Priority Data

Feb. 14, 2006  (JP) .................................. 2006-036669
Sep. 22, 2006  (JP) .................................. 2006-256953

(51) Int. Cl.
*H01L 27/092* (2006.01)
(52) U.S. Cl. ................. 257/369; 257/E27.062; 438/199
(58) Field of Classification Search .................. 257/369, 257/407, E29.161; 438/199
See application file for complete search history.

(56) References Cited

U.S. PATENT DOCUMENTS

| 6,054,357 | A | 4/2000 | Choi |
| 6,469,347 | B1 * | 10/2002 | Oda et al. ....................... 257/345 |
| 6,617,210 | B1 | 9/2003 | Chau et al. |
| 7,067,379 | B2 * | 6/2006 | Wen et al. ...................... 438/300 |
| 7,592,674 | B2 * | 9/2009 | Takahashi et al. ............ 257/369 |
| 2005/0070062 | A1 | 3/2005 | Visokay et al. |
| 2005/0112817 | A1 * | 5/2005 | Cheng et al. .................. 438/219 |
| 2006/0035463 | A1 * | 2/2006 | Crank et al. ................... 438/683 |
| 2007/0278587 | A1 * | 12/2007 | Aoyama et al. ............... 257/369 |

FOREIGN PATENT DOCUMENTS

| CN | 1522463 | 8/2004 |
| JP | 10-189972 | 7/1998 |
| JP | 2005-20022 | 1/2005 |
| JP | 2005-129551 | 5/2005 |
| JP | 2006-001271 | 1/2006 |

(Continued)

OTHER PUBLICATIONS

Pawlak et al, Modulation of the Workfunction of Ni Fully Silicided Gated by Doping: Dielectric and Silicide Pahse Effects:, IEEE Electron Device Letter, vol. 27, No. 2, Feb. 2006, pp. 99-101.*

(Continued)

*Primary Examiner* — Zandra Smith
*Assistant Examiner* — Paul Patton
(74) *Attorney, Agent, or Firm* — Young & Thompson

(57) ABSTRACT

A semiconductor device includes: a silicon substrate; and a field effect transistor including a gate insulating film over the silicon substrate, a gate electrode on the gate insulating film, and source and drain regions. The gate electrode includes, in part in contact with the gate insulating film, a crystallized Ni silicide region containing an impurity element of a conductivity type opposite to a conductivity type of a channel region in the field effect transistor.

25 Claims, 16 Drawing Sheets

FOREIGN PATENT DOCUMENTS

| | | |
|---|---|---|
| WO | 03/103032 | 12/2003 |
| WO | 2006/001271 | 1/2006 |
| WO | WO 2006-001271 | 1/2006 |

OTHER PUBLICATIONS

Pawlak et al, "Modulation of hte Workfuction of Ni Fully Silicided Gate by Doping: Dielectric and Silcide Phase Effectes," IEEE Electron Device Letters, vol. 27, No. 2, pp. 990101, Feb. 2006.*

Jun Yuan et al., Tunable Work Function in Fully Nickel-Silicided Polysilicon Gates for Metal Gate MOSFET Applications, IEEE Electron Device Letters, vol. 26, No. 2, Feb. 2005, pp. 87-89.

M.A. Pawlak et al., Modulation of the Workfunctionof Ni Fully Silicided GAtes by Doping: Dielectric and Silicide Phase Effects, IEEE Electron Device Letters, vol. 27, No. 2. Feb. 2006, pp. 99-101.

J. Lee et al., Tunable Work Function Dual Metal Gate Technology for Bulk and Non-Bulk CMOS, pp. 359-362.

H. Rhee et al.,"Negative BIAL Temperature Instability of Carrier-Tansport Enhanced Pmosfet With Performance Boosters",pp. 709-712.

Chinese Official Action—200680052814.3—Jul. 29, 2010.

Chinese Patent Office issued a Chinese Office Action dated Sep. 18, 2009, Application No. 2006800528143.

* cited by examiner nMOSFET  pMOSFET (a)

(b)

nMOSFET    pMOSFET

SEMICONDUCTOR DEVICE AND MANUFACTURING METHOD THEREOF

TECHNICAL FIELD

The present invention relates to a semiconductor device having a full silicide gate electrode and a manufacturing method thereof, and more particularly to a technique for enhancing the performance and reliability of MOS type field effect transistors (MOSFET; Metal Oxide Semiconductor Field Effect Transistor).

BACKGROUND ART

In the development of cutting-edge CMOS (complementary MOS) devices for which smaller and smaller transistors are required, the deterioration of the driving current due to the depletion of polycrystalline silicon (poly-Si) electrodes is posing a problem. In view of this problem, a technique of preventing the deterioration of the driving current by applying metal gate electrodes and thereby avoiding the depletion of electrodes is being studied.

The materials considered for use for the metal gate electrodes include pure metals, metal nitrides and silicides, but in any case it is required that the threshold voltages (Vth) of the n-type MOSFET (hereinafter "nMOS") and the p-type MOSFET (hereinafter "pMOS") can be set to appropriate levels.

Whereas it is required to set Vth to about ±0.1 eV for high performance CMOS transistors, in order to meet this requirement it is necessary to use for the gate electrode a material of which the work function is not greater than that of n-type poly-Si (4.0 eV) for nMOS or one of which the work function is not smaller than that of p-type poly-Si (5.2 eV) for pMOS.

As means of realizing these objectives, a method of controlling the Vth of transistors by separately using heterogeneous metals or alloys having different work functions for the gate electrodes of nMOS and pMOS (dual metal gate technique) is proposed.

For instance, it is stated in Non-Patent Document 1 (International electron devices meeting technical digest 2002, p. 359) that the work functions of Ta and Ru formed on $SiO_2$ are 4.125 eV and 4.95 eV, respectively, and work function modulation by 0.8 eV is possible between these two electrodes.

On the other hand, techniques regarding full silicide electrodes in which poly-Si is fully silicided with Ni, Hf, W or the like is now attracting attention.

For instance, Patent Document 1 (U.S. Patent Application Laid-Open No. 2005/0070062) discloses that, by using $SiO_2$ as the gate insulating film and a silicide electrode obtained by full silicidation of poly-Si into which impurities including P and B have been implanted as the gate electrode, (1) the formation process can be made more compatible with conventional CMOS processes and (2) the threshold voltage can be controlled by adding impurities to poly-Si before silicidation over $SiO_2$.

This disclosure suggests that the full silicide electrode is a promising metal gate. In particular, the threshold control made possible by adding impurities resulted in an effective work function of about 4.2 to 4.4 eV for nMOS or about 4.7 to 4.9 eV for pMOS where impurities used in conventional semiconductor processes (B, Al, Ga, In and Ti for pMOS or N, P, As, Sb and Bi for nMOS) were applied. Such variations in threshold occur from the segregation of the added impurities on the silicide electrode/$SiO_2$ gate insulating film interface by the so-called "snowplowing" effect at the time of silicidation. As the threshold control by the addition of impurities enables differentiated production of pMOS and nMOS, it is considered a promising method for controlling the threshold of transistors using $SiO_2$ as the gate insulating film.

Further, according to a technique described in Patent Document 2 (Japanese Patent Application Laid-Open No. 2005-129551), where gate electrodes have the Ni content of 30 to 60% and contain n-type impurities for nMOS and gate electrodes have the Ni content of 40 to 70% and contain p-type impurities for pMOS, effective work functions of about 4.1 eV and 5.1 eV have been obtained, respectively.

However, these techniques involve the following problems,

The dual metal gate technique for differentiated production of heterogeneous metals or alloys having different work functions requires a process for removing the metal layer deposited over either the pMOS or nMOS gate insulating film by etching, which deteriorates the quality of the gate insulating film during etching, thereby causing a drop in the performance characteristics and reliability of the element.

When an NiSi electrode (nickel monosilicide electrode) obtained by implanting an impurity such as P and B into poly-Si and fully silicidating the poly-Si with Ni is used as the gate electrode on the $SiO_2$ gate insulating film, the effective work function achieved for nMOS is about 4.2 to 4.4 eV or the effective work function achieved for pMOS is about 4.7 to 4.9 eV, as described above, but realization of a high performance transistor requires achievement of a lower threshold by controlling the effective work function.

According to Patent Document 2, where gate electrodes have the Ni content of 30 to 60% and contain n-type impurities for nMOS and gate electrodes have the Ni content of 40 to 60% and contain p-type impurities for pMOS, effective work functions of about 4.1 eV and 5.1 eV are obtained, respectively. However, no Ni silicide electrode having effective work functions permitting achievement of a threshold required for realizing high performance nMOS and pMOS in this composition region (4.0 eV for nMOS and 5.2 eV for pMOS) has been discovered as yet.

As the tightness of adhesion between the gate electrode and $SiO_2$ gate insulating film is very poor when the Ni content of the gate electrode is 40% or above, the gate electrode/insulating film interface is apt to come off, often causing a deterioration in element performance. Also, when the Ni content of the gate electrode is 40% or above, compressive stress attributable to the electrode is known to work on the gate insulating film and result in a drop in the reliability of the gate insulating film (International electron devices meeting technical digest 2005, p. 709). By reason of these points, it is preferable for the Ni content of the Ni silicide electrode to be less than 40%, but no Ni silicide electrode capable of realizing a threshold needed for high performance pMOS in this content region has been discovered as yet.

In fabricating a CMOS device, it is preferable for both nMOS and pMOS silicide electrodes to be formed in one round of silicidation with a view to cost reduction through simplification of the process. To achieve this purpose, it is necessary for the nMOS and pMOS Ni full silicide gate electrodes to have the same composition, but no Ni silicide electrode having effective work functions to permit realization of thresholds needed for a high performance CMOS device (4.0 eV for nMOS and 5.2 eV for pMOS), while the silicides that constitute the nMOS and pMOS gate electrodes have the same composition, has been discovered as yet.

It is also required, along with the miniaturization of elements, to restrain unevenness of the thresholds of transistors.

DISCLOSURE OF THE INVENTION

An object of the present invention is to provide a semiconductor device enhanced in the performance and reliability of elements and a manufacturing method thereof.

According to the invention, the following semiconductor devices and manufacturing methods thereof are provided.

(1) A semiconductor device including:
a silicon substrate; and
a field effect transistor including a gate insulating film over the silicon substrate, a gate electrode on the gate insulating film, and source and drain regions, wherein
the gate electrode includes, at least in part in contact with the gate insulating film, a crystallized Ni silicide region containing an impurity element of a conductivity type opposite to a conductivity type of a channel region in the field effect transistor.

(2) The semiconductor device according to item 1, wherein the silicide making up the crystallized Ni silicide region has a composition represented by $Ni_xSi_{1-x}(0.2 \leq x < 0.4)$.

(3) The semiconductor device according to item 1 or 2, wherein the silicide making up the crystallized Ni silicide region includes an $NiSi_2$ phase.

(4) The semiconductor device according to any one of items 1 to 3, wherein the silicon substrate includes, at least in part in contact with the gate insulating film, a region containing fluorine atoms in the case of a P-channel transistor and a region containing nitrogen atoms in the case of an N-channel transistor.

(5) A semiconductor device including:
a silicon substrate;
a P-channel field effect transistor including a first gate insulating film over the silicon substrate, a first gate electrode on the first gate insulating film, and first source and drain regions; and
an N-channel field effect transistor including a second gate insulating film over the silicon substrate, a second gate electrode on the second gate insulating film, and second source and drain regions, wherein
the first gate electrode includes, at least in part in contact with the first gate insulating film, a crystallized Ni silicide region containing p-type impurities, and
the second gate electrode includes, at least in part in contact with the second gate insulating film, a crystallized Ni silicide region containing n-type impurities.

(6) The semiconductor device according to item 5, wherein the silicides making up the crystallized Ni silicide regions of the first and second gate electrodes have a composition represented by $Ni_xSi_{1-x}(0.2 \leq x < 0.4)$.

(7) The semiconductor device according to item 5, wherein the silicides making up the crystallized Ni silicide regions of the first and second gate electrodes includes $NiSi_2$ phases.

(8) The semiconductor device according to any one of items 5 to 7, wherein the first and second gate electrodes include, in respective parts in contact with the first and second gate insulating films, regions containing an impurity element of a higher concentration than above the regions, (9) The semiconductor device according to any one of items 5 to 8, wherein the first and second gate electrodes include, in respective parts in contact with the first and second gate insulating films, regions having impurity concentration of $1 \times 10^{20}$ $cm^{-3}$ or above.

(10) The semiconductor device according to any one of items 5 to 9, wherein the first and second gate insulating films are silicon oxide films or silicon oxynitride films.

(11) The semiconductor device according to any one of item 5 to 9, wherein the first and second gate insulating films include silicon oxide films, silicon oxynitride films or silicon nitride films respectively in contact with the first and second gate electrodes.

(12) The semiconductor device according to any one of items 5 to 11, wherein the silicon substrate includes, at least in part in contact with the first gate insulating film, a region containing fluorine atoms.

(13) The semiconductor device according to any one of items 5 to 12, wherein the silicon substrate includes, at least in part in contact with the second gate insulating film, a region containing nitrogen atoms.

(14) A method of manufacturing the semiconductor device as described in item 5, including:
providing a silicon substrate including an n-type active region and a p-type active region;
forming a insulating film for first and second gate insulating films over the silicon substrate;
forming a silicon film for gate over the insulating film;
adding p-type impurities to the silicon film for gate in a region where a P-channel field effect transistor is to be formed;
adding n-type impurities to the silicon film for gate in a region where a N-channel field effect transistor is to be formed;
forming a gate pattern by processing the silicon film for gate;
forming first source and drain regions in the region where the P-channel field effect transistor is to be formed;
forming second source and drain regions in the region where the N-channel field effect transistor is to be formed;
forming an interlayer insulating film so as to cover the gate pattern,
removing upper part of the interlayer insulating film so as to expose the gate pattern;
forming a nickel film over the exposed gate pattern;
conducting heat treatment to silicide the gate pattern, thereby forming first and second gate electrodes; and
selectively removing superfluous nickel of unsilicided part of the nickel film.

(15) The semiconductor device manufacturing method according to item 14, wherein the p-type impurities and the n-type impurities are added by ion implantation.

(16) The semiconductor device according to item 14 or 15, further including: adding fluorine to the silicon substrate in the region where the P-channel field effect transistor is to be formed before forming the insulating film for the first and second gate insulating films.

(17) The semiconductor device according to any one of item 14 to 16, further including: adding nitrogen to the silicon substrate in the region where the N-channel field effect transistor is to be formed before forming the insulating film for the first and second gate insulating films.

According to the invention, a transistor having high performance and reliability and a simple method of manufacturing the same can be provided.

BEST MODE FOR CARRYING OUT THE INVENTION

Figure 1:
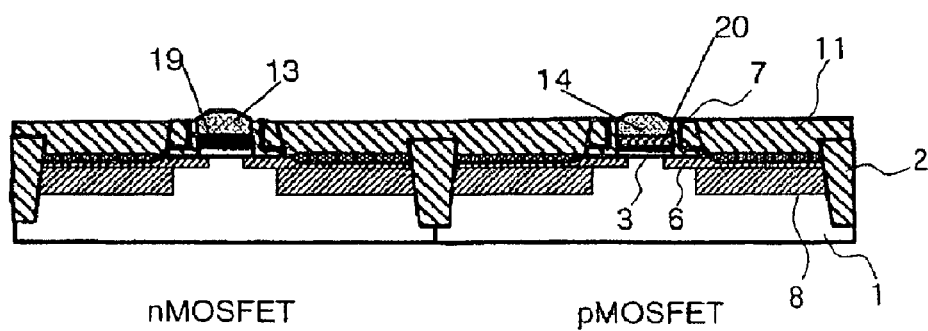
FIG. 1 is a schematic sectional view illustrating a semiconductor device in accordance with an exemplary embodiment of the invention.
Figure 1:
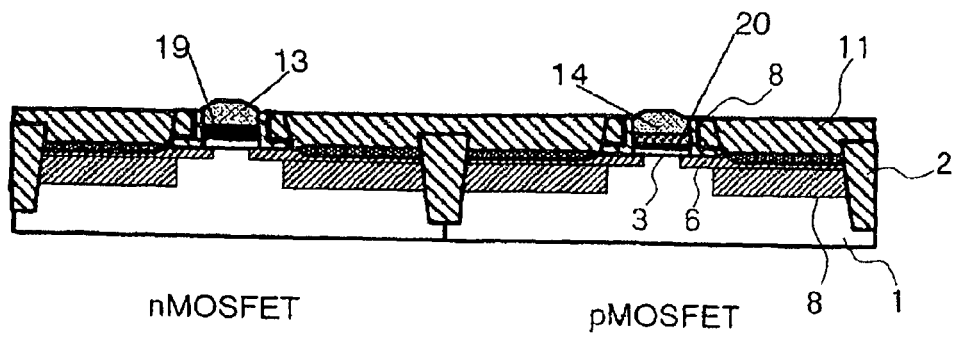

The present invention will be described in detail below with reference to exemplary embodiments thereof.

The invention is based on the following facts which were newly discovered.

When a gate electrode made up of highly crystalline Ni silicide to which impurity elements have been added is formed over a gate insulating film, the variation of the effective work function due to the addition of the impurity elements (the difference between the case in which the impurity elements have been added and the undoped case) increases along with a decrease in the Ni content of the silicide, and an effective work function more suitable for threshold control than what is based on the related art can be realized. In particular, where a crystallized Ni silicide whose Ni content is less than 40% and to which impurity elements have been added is used for a gate electrode, a pMOS and an nMOS lower in threshold than what is based on the related art can be realized.

The findings above were derived from the following preliminary experiment using MOS capacitances.

First, an $SiO_2$ gate insulating film (thickness: 3 nm) was formed over a silicon substrate, and a polycrystalline silicon (poly-Si) film of 80 nm in thickness was formed over that film.

Next, impurity elements were ion-implanted into the poly-Si film. The added impurity elements were of a conductivity type opposite to that of the channel region of a transistor (namely the conductivity type opposite to the conductivity type of the silicon substrate active region immediately underneath the gate insulating film where the channel is formed). For instance, in order to realize an nMOS, N, P, As, Sb, Bi and so forth which are n-type impurities with respect to Si, and to realize a pMOS, B, Al, In, Ga, Tl and so forth which are p-type impurities with respect to Si can be ion-implanted.

After that, an Ni film (thickness: $T_{Ni}$) was deposited over the poly-Si film (thickness: $T_{Si}$), followed by heat treatment to fully silicide the poly-Si film.

Table 1 shows the thickness ratio between the poly-Si film (Si film) before the silicidation and the Ni film on one hand and the type of the crystalline phase of the nickel silicide formed by the silicidation on the other.

As shown in Table 1, the crystalline phase of the nickel silicide is determined stepwise relative to the thickness of the Ni film deposited over the poly-Si film, namely the quantity of Ni supplied to poly-Si. For instance, when it is desired to make the crystalline phase of the Ni silicide near the gate electrode/insulating film interface, which affects the effective work function, mainly an NiSi phase, the ratio ($T_{Ni}/T_{Si}$) between the thickness ($T_{Si}$) of the poly-Si film and the thickness ($T_{Ni}$) of the Ni film can be set in the range between 0.55 and 0.95 or, when it is desired to make it mainly an $Ni_3Si$ phase, $T_{Ni}/T_{Si}$ can be set to 1.6 or above. When it is desired to make the crystalline phase of Ni silicide near the gate electrode/insulating film interface a silicide whose main component is an $NiSi_2$ phase, it is necessary to set $T_{Ni}/T_{Si}$ in the range between 0.28 and 0.54 and the silicidation temperature to not less than 600° C., or more preferably not less than 650° C. As the composition ratio (Ni/(Ni+Si)) which determines the work function of the Ni silicide is determined in a virtually self-matching manner by the formation of the crystalline phase such as $NiSi_2$, NiSi or $Ni_3Si$, the margins allowed for the process conditions including the Ni film thickness and the silicidation temperature for obtaining the same crystalline phase (namely for obtaining the same work function) are broad, making it possible to restrain fluctuations attributable to the manufacturing process.

TABLE 1

| | | Ratio of Ni film thickness/Si film thickness | | |
|---|---|---|---|---|
| | | 0.28-0.54 | 0.55-0.95 | 1.6 or above |
| Annealing temperature | 650° C. | $NiSi_2$ (+NiSi) | | |
| | 600° C. | NiSi | | |
| | 500° C. | NiSi | NiSi | $Ni_3Si$ (+NiSi) |
| | 450° C. | | NiSi | $Ni_3Si$ (+NiSi) |
| | 400° C. | | NiSi | $Ni_3Si$ (+NiSi) |

During this full silicidation, impurity elements were segregated near the silicide electrode/insulating film interface by the "snowplowing" effect. At that time, when the concentration of the segregated impurity elements fell below $1 \times 10^{20}$ cm$^{-3}$ near that interface, the effective work function hardly varied. Therefore, in order to vary the effective work function, it is preferable to have, in the gate electrode part near the gate electrode/gate insulating film interface, a segregated impurities region containing impurities of a higher concentration than above region, and it is preferable for the impurities concentration in the segregated impurities region to be not below $1 \times 10^{20}$ cm$^{-3}$. On the other hand, from the viewpoint of reliability of elements, it is preferable for the concentration of the impurities of this segregated impurities region to be not higher than $1 \times 10^{23}$ cm$^{-3}$, and even more preferable to be not higher than $5 \times 10^{22}$ cm$^{-3}$. Thus, it is preferable for the gate electrode for use in the invention to contain impurity elements in the concentration range stated above in the part in contact with the gate insulating film. It is also preferable for the impurities region (segregated impurities region) in this concentration range in the gate electrode to be present for 5 nm or more in the thickness direction (the direction perpendicular to the substrate plane) from the gate electrode/insulating film interface.

The crystalline phase of the Ni silicide of the MOS capacitance fabricated as described above was identified by XRD. As shown in Table 1, where $T_{Ni}/T_{Si}=0.28$ to 0.54, the Ni silicide that is formed substantially is made up of $NiSi_2$. However, in XRD, $NiSi_2$ is weak in peak intensity, and a peak of NiSi is witnessed. According to an analysis of the silicide electrode composition in the depthwise direction by XPS, a slightly higher Ni content than that in $NiSi_2$ is found on the electrode surface side, and therefore NiSi is present mainly in that part. Where $T_{Ni}/T_{Si}=0.55$ to 0.95, the Ni silicide that is formed is substantially made up of NiSi. Where $T_{Ni}/T_{Si}$ is 1.6 or above, the Ni silicide that is formed is substantially made up of $Ni_3Si$.

Figure 2:
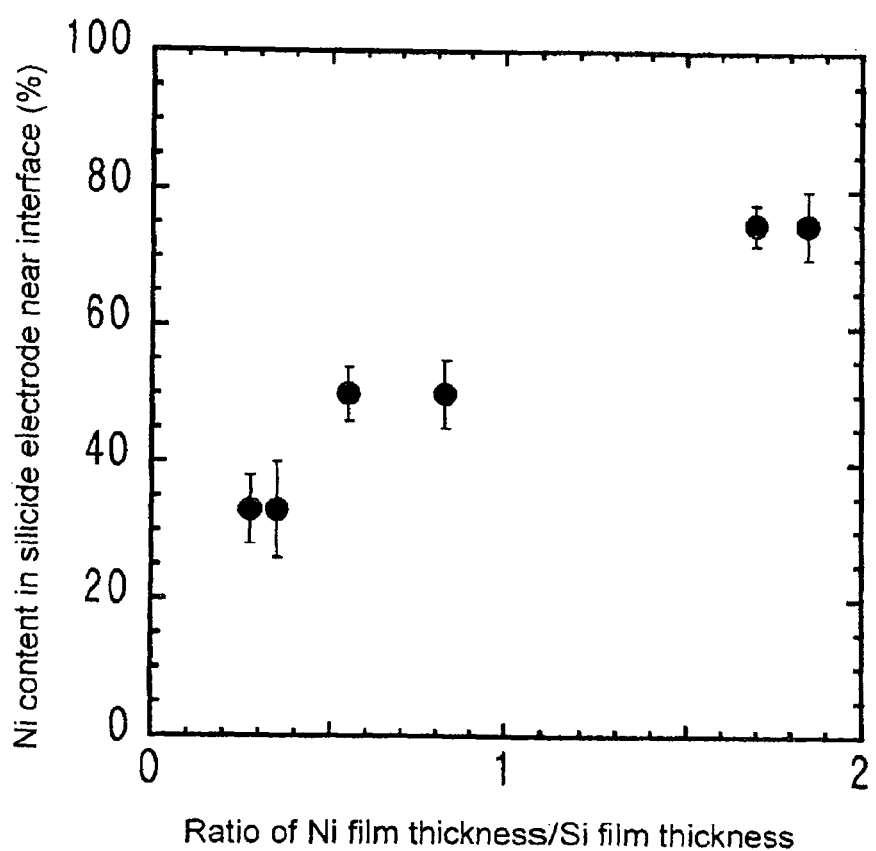
FIG. 2 is a diagram showing the relationship between the composition of crystallized Ni silicide and the film thickness ratio between polycrystalline silicon before silicidation and Ni (Ni film thickness/Si film thickness)

FIG. 2 shows the relationship between the Ni content in the electrode near the electrode/insulating film interface of the MOS capacitance fabricated as described above and the ratio ($T_{Ni}/T_{Si}$) of the Ni film thickness before silicidation/poly-Si film thickness (Si film thickness). The Ni content in the electrode was figured out from the XPS measurement, The error bars of electrode composition represent fluctuations in the multi-point XPS measurement.

It is seen from this diagram that the Ni content in the electrode near the interface is determined stepwise according to the $T_{Ni}/T_{Si}$ ratio. For instance, at $T_{Ni}/T_{Si}=0.28$ to 0.54, 0.55 to 0.95 and 1.6 or above, the Ni content in the electrode near the interface was respectively 33.3±7%, 50±5% and 75±5%. These compositions have substantially corresponded to the Ni content of $NiSi_2$ (33.3%), the Ni content of NiSi (50%), and the Ni content of $Ni_3Si$ (75%), respectively. This is probably due to the self-matching determination of the Ni content in the electrode near the interface by the crystalline phase as shown in Table 1.

Figure 3:
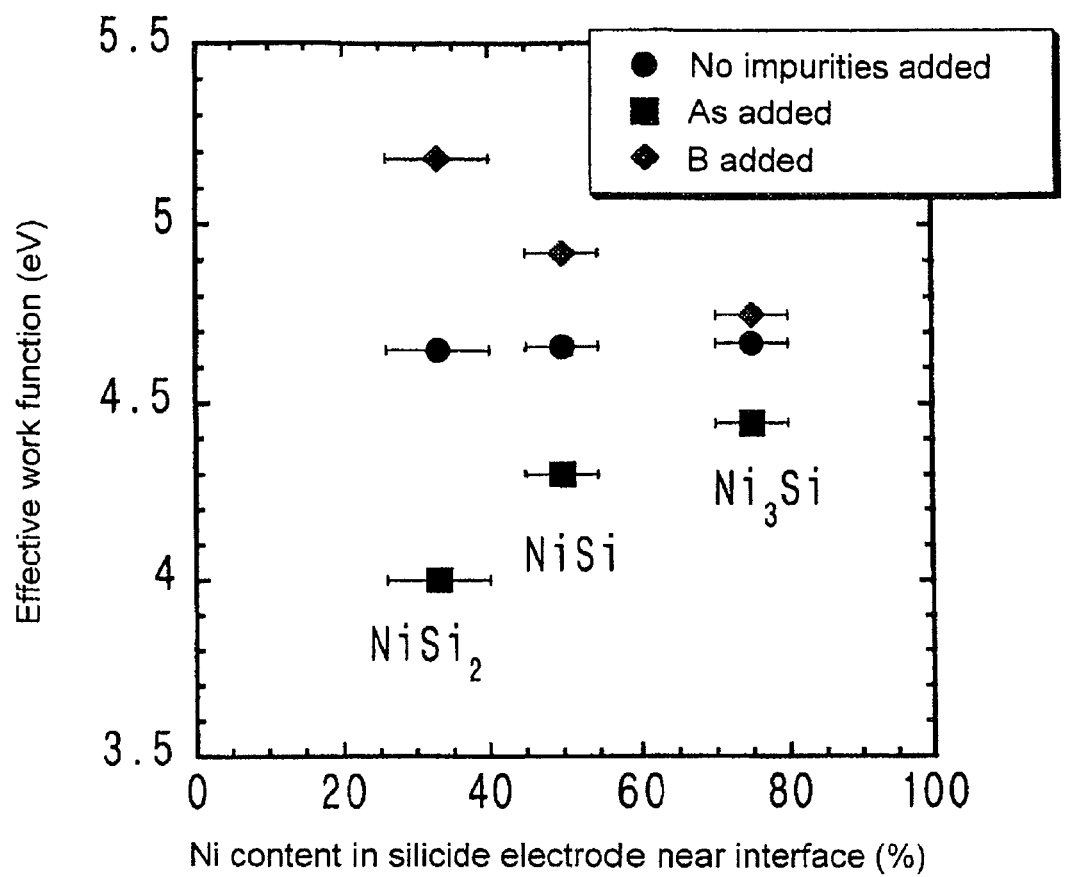
FIG. 3 is a diagram showing the relationship among the effective work function of crystallized Ni silicide, Ni content and the effect of addition of impurities.

FIG. 3 shows, with respect to the MOS capacitance fabricated as described above, the relationships between the effective work function of crystallized Ni silicide and the silicide electrode composition near the interface in the case where no impurity elements have been added (undoped), in the case where As has been added, and in the case where B has been added (the doses of As and B added into poly-Si are both $5 \times 10^{20}$ cm$^{-3}$). The error bars of electrode composition represent fluctuations in the multi-point XPS measurement. The figure shows the main crystalline phase in that composition.

As is seen from this figure, when no impurity elements have been added, the effective work function of the crystallized Ni silicide is hardly dependent on the composition. Therefore, even if the Ni content fluctuates by ±5% or so, fluctuations of the threshold can be restrained.

To look at the cases in which any impurity has been added, the variation of the effective work function due to the impurity addition (the difference between the case in which any impurity has been added and the undoped case) increases with a decrease in the Ni content (an increase in the Si content). In particular, in the region in which the Ni content is from 26 atom % to 40 atom % where the main crystalline phase is $NiSi_2$, the effective work function is 4.0 eV under doping with As or 5.2 eV under doping with B, indicating that an effective work function required for high performance CMOSFET device (4.0 eV or less for nMOS, 5.2 eV or above for pMOS) can be realized.

The tendency of the variation of the effective work function due to the impurity addition to increase with a decrease in the Ni content in the Ni silicide (an increase in the Si content) was confirmed with every impurity having the effect to modulate the work function. In particular, the effective work function in crystallized $NiSi_2$ was 4.0 eV or less with n-type impurities (N, P, As, Sb, Bi and so forth) and 5.2 eV or more with p-type impurities (B, Al, In, Ga, Tl and so forth), which demonstrates that the effective work function requirement for high performance CMOS devices (4.0 eV or less for nMOS, 5.2 eV or above for pMOS) can be achieved.

This dependence of the variation of the effective work function due to impurity addition on the Ni content in the electrode is entirely different from the tendency disclosed in Japanese Patent Application Laid-Open No. 2005-129551 (Patent Document 2). In particular, where any p-type impurity is added, the resultant trend of the dependence of the effective work function on the Ni content in the electrode is reverse between this exemplary embodiment and the case of Patent Document 2.

This is attributable to the following reason. In the case of Patent Document 2, the variation of the effective work function due to impurity addition (the difference between the case in which any impurity has been added and the undoped case) is dependent solely on the type and quantity of the impurity, but hardly on the composition of the Ni silicide electrode. Further, the effective work function of an undoped Ni silicide electrode rises (from 4.43 eV to 5.1 eV) with an increase in the Ni content (from 30 atom % to 100 atom %). In the case of this exemplary embodiment, unlike that, the effective work function of the undoped crystallized Ni silicide is hardly dependent on the Ni content, and the variation of the effective work function increases with a decrease in the Ni content (an increase in the Si content) as shown in FIG. 3. In this way, the present invention and the technique according to Patent Document 2 are greatly different in the dependence of the variation of the effective work function due to impurity addition on the composition of the electrode. This difference is probably attributable to a difference in crystallinity resulting from a difference in formation method as will be described afterwards with reference to the comparative example.

Figure 4:
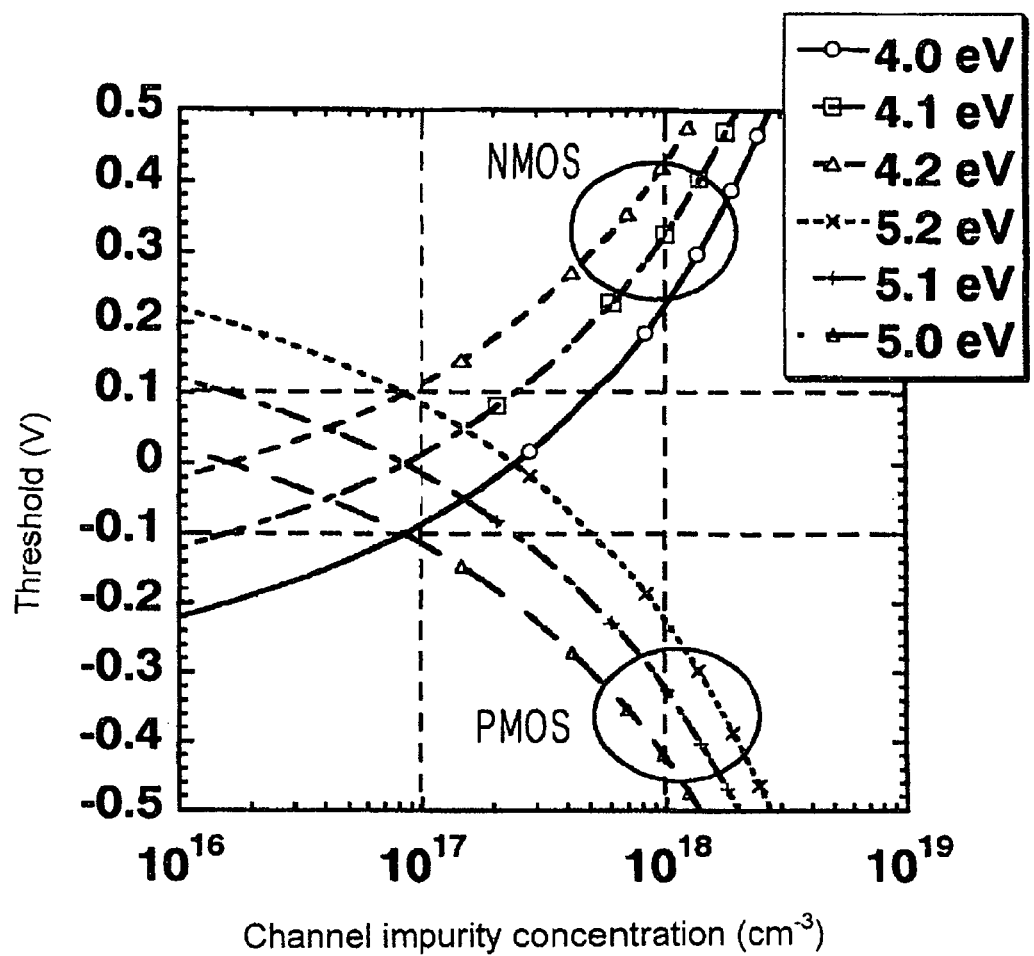
FIG. 4 is a diagram illustrating the range of thresholds of transistors that can be realized with work functions of silicide electrodes fabricated according to an exemplary embodiment of the invention.

As shown in FIG. 3, the effective work function of the doped Ni silicide, as it is affected by the Ni content, it is preferable to form a silicide in which the Ni content is determined in a self-matching manner, Namely, it is preferable to form a silicide whose main crystalline phase is a thermodynamically stable crystalline phase, especially to form a silicide whose main crystalline phase is a $NiSi_2$ crystalline phase. As stated above, since the formation of the $NiSi_2$ crystalline phase causes the Ni content to be determined in a self-matching manner, the margins allowed for the process conditions are broad, making it possible to restrain fluctuations of the Ni content attributable to the manufacturing process. Thus, according to the present invention in which doped crystallized NiSi$_2$ may be applied to the gate electrode, as the electrode composition is determined at the time of full silicidation in a self-matching manner, it is made possible to form a transistor whose threshold fluctuations are restrained. Further, as a silicide whose Ni content is less than 40 atom % can be formed, the adhesion between the silicide electrode and the gate insulating film is tightened, and a compressive stress on the gate insulating film attributable to the gate electrode can be suppressed, enabling a more reliable transistor to be formed.

Where the oxide film thickness is 1.8 nm, the threshold (Vth) range of MOSFET predictable from the effective work function is as shown in FIG. 4 relative to the channel impurity concentration. According to the present invention which uses a crystallized Ni silicide electrode whose effective work function can be modulated to 4.0 eV or less for nMOS or 5.2 eV or more for pMOS by adding impurity elements, a high performance device having a low threshold of around 0.1 V, a level that cannot be achieved by using a conventional impurity element-doped NiSi electrode in the channel concentration of usual CMOS devices ($10^{17}$ to $10^{18}$ cm$^{-3}$) can be realized.

According to the invention, it is preferable for the crystallized Ni silicide constituting the gate electrode to be less than 40 atom % in Ni content. An Ni content of less than 40 atom % enables the gate electrode to adhere more tightly to the gate insulating film such as silicon oxide film (SiO$_2$ film) and silicon oxynitride film (SiON film), and almost completely prevents electrode-attributable stress from occurring, making it possible to enhance the reliability of MOSFETs.

According to the invention, it is preferable for the Ni content of the crystallized Ni silicide constituting the gate electrode to be not less than 5 atom %, more preferable to be not less than 10 atom %, from the viewpoints of restraining gate depletion and reducing gate resistance; it is further preferable to be not less than 20 atom %, more preferable to be not less than 25 atom % and especially preferable to be not less than 30 atom % from the viewpoint of threshold control. Taking into consideration the threshold control aspect in addition to the aforementioned reliability enhancement, it is preferable for this Ni content to be not more than 38 atom %, more preferable to be not more than 35 atom %. Incidentally, the Ni content is represented in a percentage of ratio of the Ni quantity to the total quantity of Ni and Si (Ni/(Ni+Si)) in terms of the number of atoms. Thus, Ni silicides represented by Ni$_x$Si$_{1-x}$ ($0.1 \leq x < 0.4$) is preferable with a view to restraining gate depletion, reducing gate resistance and improving the reliability, and considering threshold control in addition to these points, Ni$_x$Si$_{1-x}$ ($0.2 \leq x < 0.4$) is more preferable. It is further preferable for x in these formulas to be in the preferable range for the Ni content from the viewpoints stated above.

It is preferable for the gate electrode according to the invention, with a view to achieving a desired effective work function, to have the region of the crystallized silicide having the Ni content as stated above extending for 5 nm or more, more preferable to have it for 10 nm or more, in the thickness direction (the direction perpendicular to the substrate plane) from the gate electrode/insulating film interface.

As the doped crystallized Ni silicide electrode as stated above is applied to the gate electrode according to the invention, when a CMOS device is to be fabricated, Ni silicide electrodes for nMOS and pMOS can be formed at a single silicidation step as will be described afterwards. Accordingly, the number of steps can be reduced and the process simplified, resulting in a cost saving.

As the gate insulating film in the invention, a silicon oxide film (SiO$_2$ film) or a silicon oxynitride film (SiON film) can be used. Also, a high dielectric constant insulating film, such as an HfSiON film may be used as the gate insulating film. In this case, though the range of threshold variation due to impurity addition is smaller than where SiO$_2$ and SiON gate insulating films are used, the variation of the effective work function can be increased by placing a silicon oxide film, a silicon oxynitride film or a silicon nitride film in the part in contact with the gate electrode, and this would enable a low threshold to be realized in MOSFETs. Between the high dielectric constant insulating film and the silicon substrate, a silicon oxide film or a silicon oxynitride film may as well be provided.

FIG. 1 shows a schematic sectional view of a CMOSFET structure in which a doped Ni silicide is used as the gate electrode. In the figure, reference numeral 1 designates a silicon substrate; 2, an element separation region; 3, a gate insulating film; 6, an extension diffusion region; 7, a gate side wall; 8, a source-drain diffusion region; 11, an interlayer insulating film; 13, an n-type full silicide gate electrode; 14, a p-type full silicide gate electrode; and 19 and 20, segregated impurities regions. Such a CMOS structure can achieve, in addition to the effect of avoiding gate electrode depletion, high performance transistors considered impractical so far with a high level of reliability and reproducibility.

If fluorine atoms are provided in the silicon substrate of the pMOS region at least in the part in contact with the gate insulating film in addition to the configuration described above, the effective work function of the gate electrode can be increased by about 0.1 eV, thereby enabling the threshold in pMOS to be reduced by about 0.1 V. Also, if nitrogen atoms are provided in the silicon substrate of the nMOS region at least in the part in contact with the gate insulating film, the effective work function of the gate electrode can be reduced by about 0.1 eV, thereby enabling the threshold in nMOS to be lowered by about 0.1 V.

According to the invention, the work function of the gate electrode of pMOS and the work function of the gate electrode of nMOS, as stated above, can be controlled with the composition of the silicide making up the gate electrode and impurities contained in the silicide. Thus, the crystallized silicides of the same composition can be formed as the gate materials in the pMOS region and the nMOS region, with the silicide of the pMOS region and the silicide of the nMOS region containing different impurities. Therefore, in the manufacturing process according to the invention, after the formation of the gate material over the gate insulating film, no step to remove this gate material needs to be carried out, and gate electrodes having different work functions between pMOS and nMOS can be formed. For this reason, the surface of the gate insulating film is not exposed to the wet etching liquid or an organic solvent, and accordingly the quality of the gate insulating film is not adversely affected. As a result, highly reliable CMOS devices can be fabricated. Furthermore, as the addition of impurities to the gate material can be accomplished accurately by an already established technique, such as ion implantation, fluctuations of the threshold can be restrained.

The invention will be described more specifically below with reference to drawings.

FIRST EXEMPLARY EMBODIMENT

Figure 5:
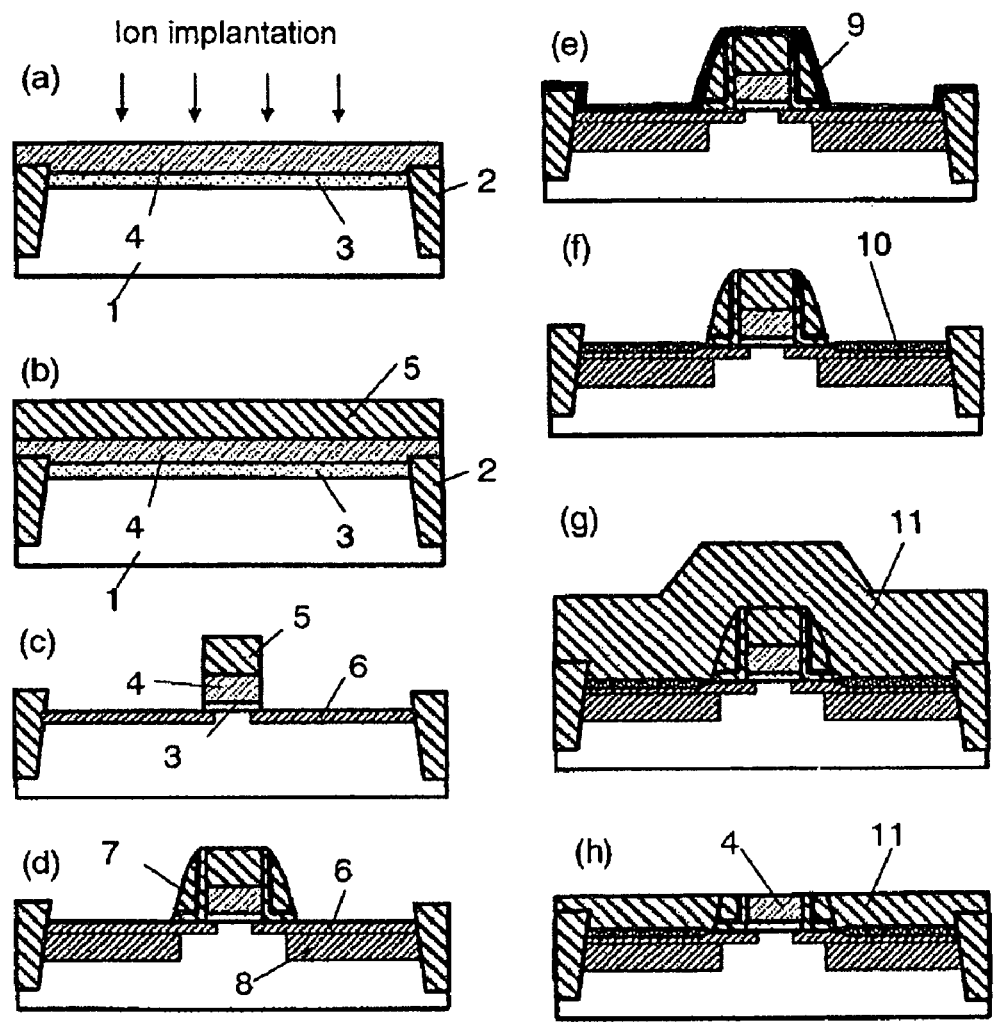
FIG. 5 are sectional views of steps of a semiconductor device manufacturing method in accordance with an exemplary embodiment of the invention.
Figure 6:
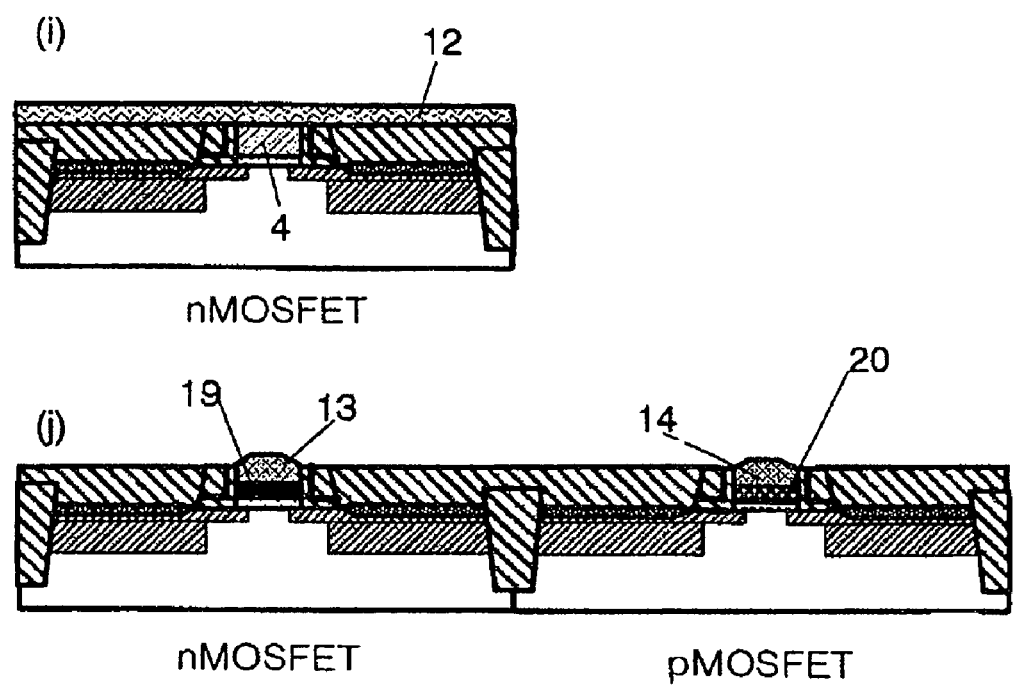
FIG. 6 are sectional views of steps of the semiconductor device manufacturing method in accordance with the exemplary embodiment of the invention.

FIGS. 5(*a*) through 5(*h*), FIGS. 6(*i*) through 6(*j*) are sectional views showing a MOSFET manufacturing process pertaining to a first exemplary embodiment of the invention.

First, the element separation region 2 was formed in the surface region of the silicon substrate 1 by applying the STI (Shallow Trench Isolation) technique. Then, the gate insulating film 3 made up of SiON was formed over the element-separated silicon substrate surface.

Next, as shown in FIG. 5(a), a poly-Si film 4 of 80 nm in thickness was formed over the gate insulating film 3 and, by carrying out ion implantation in combination with a usual PR process using a resist, different impurity elements were ion-implanted into the nMOS region and the pMOS region of this poly-Si film. As was implanted into the nMOS region, and B, into the pMOS region. The implantation energy and doses were respectively 5 KeV and $5 \times 10^{15}$ cm$^{-2}$ for As and 2 KeV and $6 \times 10^{15}$ cm$^{-2}$ for B.

After that, a silicon oxide film 5 of 150 nm in thickness was stacked as shown in FIG. 5(b).

Next, as shown in FIG. 5(c), the stacked poly-Si film 4 and silicon oxide film 5 were processed using the lithography technique and the RIE (Reactive Ion Etching) technique to form a gate electrode pattern. Then, ion implantation was carried out using the gate electrode pattern as mask to form the extension diffusion region 6 in a self-matching manner This step was performed for each of the nMOS region and the pMOS region.

Next, the gate side wall 7 was formed as shown in FIG. 5(d) by depositing a silicon nitride film and a silicon oxide film in succession and etching them back after that.

Next, one of the nMOS region and the pMOS region was masked and ion implantation was again carried out into the other region to form the source-drain diffusion region 8. This step was performed on each of the nMOS region and the pMOS region. The source-drain diffusion region is activated by subsequent heat treatment.

Next, as shown in FIG. 5(e), a metal film 9 of 20 nm in thickness was deposited all over by sputtering, and a silicide layer 10 of about 40 nm in thickness was formed solely in the source-drain diffusion region by the salicide technique using the gate electrode pattern, the gate side wall and the element separation region as masks (FIG. 5(f)). As this silicide layer 10, an Ni monosilicide (NiSi) layer that could minimize the contact resistance was formed. Instead of such an Ni silicide, a Co silicide or a Ti silicide may as well be used.

Next, as shown in FIG. 5(g), the interlayer insulating film 11 made up of a silicon oxide film was formed by the CVD (Chemical Vapor Deposition) method.

This interlayer insulating film 11 was flattened by the CMP (Chemical Mechanical Polishing) technique, followed by etching back the interlayer insulating film as shown in FIG. 5(h) to expose the poly-Si film 4 of the gate electrode pattern.

Next, as shown in FIG. 6(i), an Ni film 12 for siliciding the poly-Si film 4 of the gate electrode pattern part was deposited. The Ni film thickness at this step is so set that NiSi$_2$ is formed in the part in contact with the gate insulating film when poly-Si and Ni have sufficiently reacted to form the silicide. In this exemplary embodiment, an Ni film of 25 nm was formed by DC magnetron sputtering at room temperature.

After that, gate electrodes 13 and 14 made up of crystallized NiSi$_2$ were formed by causing poly-Si and Ni to sufficiently react with each other by heat treatment at 650° C. for two minutes. In this silicidation, the dopant (As) in the silicide electrode of the nMOS region segregated in the vicinities of the electrode/insulating film interface as shown in FIG. 6(j) to form a laminar segregated impurities region 19. The dopant (B) in the silicide electrode of the pMOS region also segregated in the vicinities of the electrode/insulating film interface as shown in FIG. 6(j) to form a laminar segregated impurities region 20.

Finally, the superfluous Ni film which was not silicided at the heat treatment step was removed by wet etching using an aqueous solution of sulfuric acid-hydrogen peroxide. After that, a contact plug and upper layer wiring (not shown) were formed by usual methods.

By going through these steps, the CMOS structure having full silicide electrodes in which impurity elements differing between the nMOS region and the pMOS region are segregated in the vicinities of the electrode/insulating film interface as shown in FIG. 6(j) was formed. In the MOSFET fabricated in this way, the effective work function of the silicide electrode was 4.0 eV for nMOS and 5.2 eV for pMOS.

Figure 7:
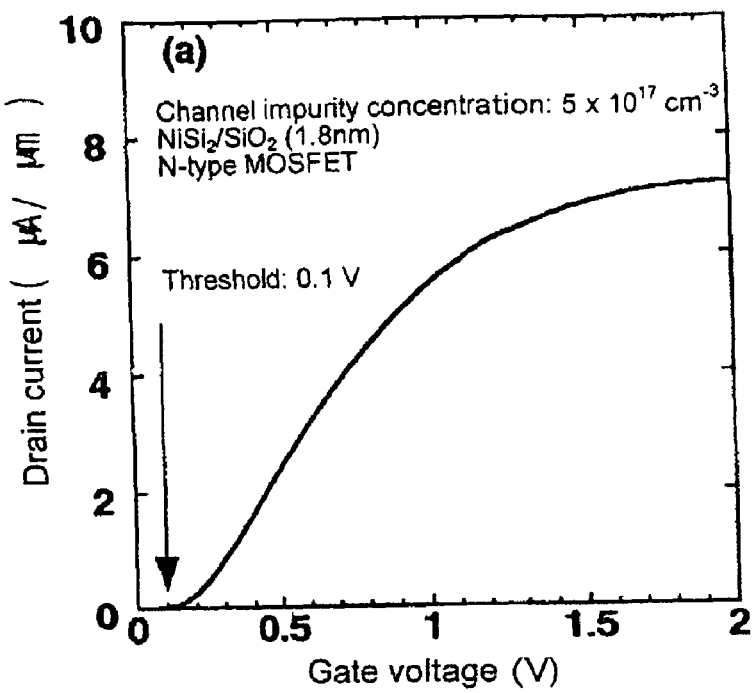
FIG. 7 are diagrams showing the results of measurement of the drain current-gate voltage characteristics of a MOSFET fabricated according to the invention (FIG. 7(a) shows the measurement results for nMOS and FIG. 7(b), those for pMOS)
Figure 7:
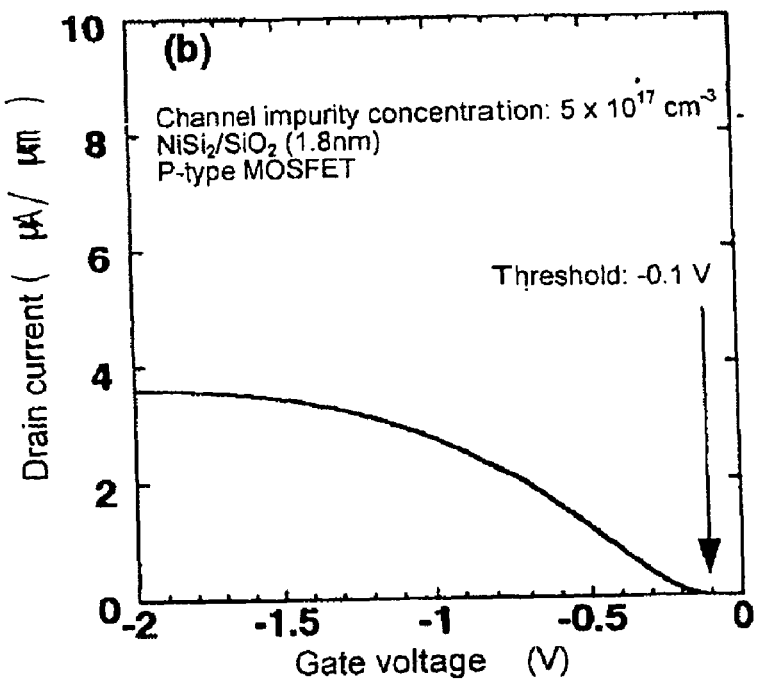

FIG. 7(a) shows the dependence of the drain current on the gate voltage in nMOS having a gate electrode (NiSi$_2$ electrode) whose effective work function has been modulated to 4.0 eV. The channel concentration is $5 \times 10^{17}$ cm$^{-3}$, and the Vth predictable from the effective work function of 4.0 eV shown in FIG. 4 is 0.1 V. According to FIG. 7(a), the Vth of nMOS having the NiSi$_2$ electrode is 0.1 V as predicted from the effective work function. It was further confirmed that the electron mobility in this transistor could have a comparable value to that of a transistor using poly-Si for the gate electrode and SiO$_2$ for the gate insulating film.

FIG. 7(b) shows the gate voltage dependence of the drain current of pMOS having a gate electrode (NiSi$_2$ electrode) whose effective work function has been modulated to 5.2 eV. The channel concentration is $5 \times 10^{17}$ cm$^{-3}$, and the Vth predictable from the effective work function of 5.2 eV shown in FIG. 4 is −0.1 V. According to FIG. 7(b), the Vth of pMOS having an NiSi$_2$ electrode is −0.1 V as predicted from the effective work function. It was further confirmed that the electron mobility in this transistor could have a comparable value to that of a transistor using poly-Si for the gate electrode and SiO$_2$ for the gate insulating film.

Incidentally, even when other p-type dopant impurities (Al, In, Ga, Tl) than B were added to the Ni full silicide electrode for pMOS and other n-type dopant impurities (N, P, Sb, Bi) than As were added to the Ni full silicide electrode for nMOS, similar effects were achieved.

Further, where a crystallized NiSi$_2$ electrode is used as the gate electrode, as it tightly adheres to the gate insulating film made up of SiO$_2$ or SiON (silicon oxynitride film) and stress attributable to the gate electrode hardly occurs, highly reliable MOSFETs can be provided, When a CMOS device is to be fabricated, according to the invention, Ni full silicide electrodes for nMOS and pMOS can be formed at a single silicidation step and accordingly the process can be simplified, resulting in a saving in manufacturing cost.

As hitherto revealed, excellent transistor performance characteristics can be achieved by combining a crystallized Ni full silicide electrode (NiSi$_2$ electrode) to which impurity elements have been added and an SiON gate insulating film.

COMPARATIVE EXAMPLE

A silicided layer was formed according to the method disclosed in Japanese Patent Application Laid-Open No. 2005-129551 (Patent Document 2) as follows: a poly-Si film was formed via a thermal oxide film over a silicon substrate; an Ni film was formed over it; and heat treatment was conducted at 400° C. for one minute to cause a siliciding reaction to take place. In accordance with this process, silicided layers differing in Ni content were formed by forming Ni films differing in thickness over poly-Si films having the certain thickness, and subjecting them to the heat treatment. The impurity concentration in the silicided layers in the vicinities of its interface with the insulating film was $10^{21}$ cm$^{-3}$ or more.

Measurement of the XRD spectrum of the silicided layers that were formed revealed, especially where ratio of the nickel film thickness ($T_{Ni}$)/poly-Si film thickness ($T_{Si}$) was smaller than 0.55, no peak accompanying crystallization, or the intensity of the peak was extremely weak; namely the silicided layers that were formed were found either non-crystalline or very low in crystallinity.

Figure 8:
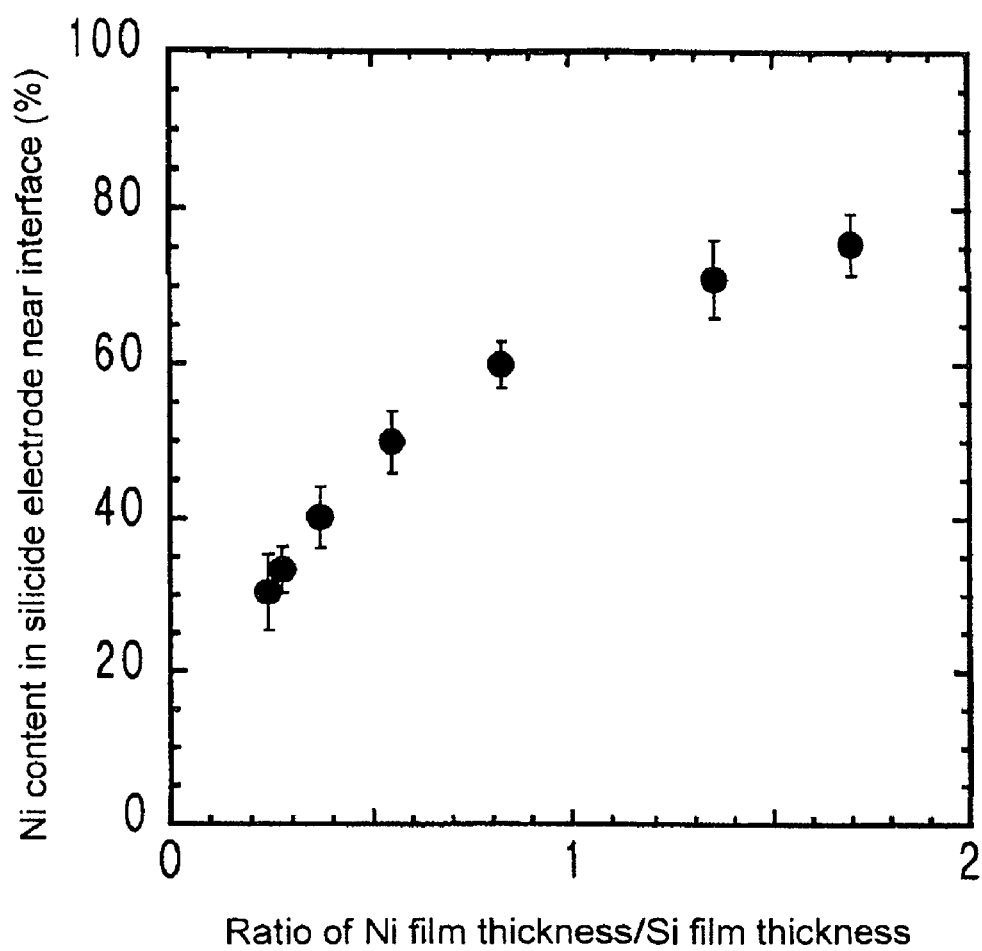
FIG. 8 is a diagram showing the relationship between the composition of Ni silicide according to the related art (comparative example) and the film thickness ratio between polycrystalline silicon and Ni before silicidation.

FIG. 8 shows the relationship between the Ni content of the silicided layer (silicide electrode) of the MOS capacitance (the composition in the vicinities of the interface between the silicided layer and the insulating film) and the Ni/poly-Si film thickness ratio ($T_{Ni}/T_{Si}$) before silicidation. This Ni content was figured out from XPS measurement. The error bars of the Ni content in the diagram represent fluctuations in the multi-point XPS measurement. It is seen from this diagram that the Ni content in the silicided layer continuously varies with the $T_{Ni}/T_{Si}$ ratio.

Figure 9:
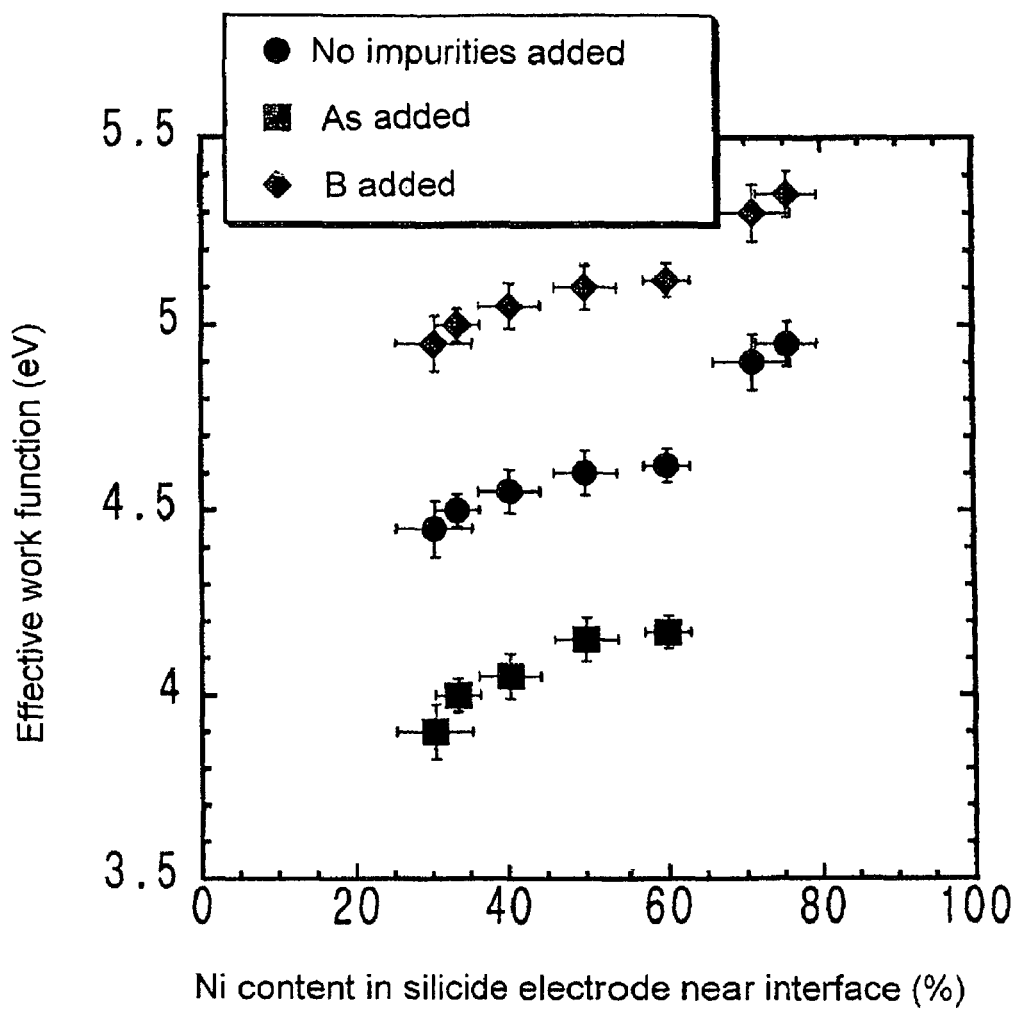
FIG. 9 is a diagram showing the relationship between the effective work function of Ni silicide according to the related art (comparative example) and the Ni content.

FIG. 9 shows the effective work functions of the silicided layer in the undoped case along with the cases of As addition and B addition. It is seen from this diagram that, in the undoped case, the effective work function of the silicided layer rises with an increase in the Ni content. Therefore, fluctuations of the Ni content by about ±5%, for instance, would cause threshold fluctuations by 0.1 to 0.2 V or so. This tendency is entirely different from the case of the crystallized Ni full silicide electrode formed in accordance with the embodiment of the invention as described above. This difference in effective work function variation attributable to the electrode composition is probably due to the difference in crystallinity ensuing from the difference in formation method. While silicidation is achieved by heat treatment at 400° C. for one minute according to the method disclosed in Patent Document 2, the silicided layer that was obtained was found either non-crystalline or very low in crystallinity as stated above. On the other hand, as the siliciding conditions according to the embodiment of the invention are 400° C. for five minutes where $T_{Ni}/T_{Si}$ is 0.55 or above and 650° C. for two minutes where $T_{Ni}/T_{Si}$ is less than 0.55, an Ni silicide electrode of superior crystallinity is formed, and an Ni silicide electrode of high crystallinity is formed especially when $T_{Ni}/T_{Si}$ is less than 0.55.

FIG. 9 also shows the effective work functions of silicided layers formed by the method described in Patent Document 2, doped with impurities (As and B). It is seen from this diagram that, in the doped cases as well, the effective work function rises with an increase in the Ni content of the parent silicided layer. Thus, no significant increase in the variation of the effective work function according to the Ni content (the difference between the case in which any impurity has been added and the undoped case) is observed. This tendency is entirely different from the case of the crystallized Ni full silicide electrode formed in accordance with the invention. Thus in the crystallized Ni full silicide electrode according to the invention, the variation of the effective work function increases with a decrease in the Ni content (an increase in the Si content). This difference in the electrode-composition dependence of effective work function variation attributable to the addition of impurities is probably due to the difference in crystallinity ensuing from the difference in formation method as in the undoped case described above.

Further, the effective work function of the doped silicided layer formed by the method described in Patent Document 2 was found to be about 4.1 eV where the Ni content was 30 to 60 atom % and n-type impurities were contained, while the effective work function of about 5.1 eV was obtained where the Ni content was 40 to 70 atom % and p-type impurities were contained, but no Ni silicide electrode having an effective work function that could realize a threshold required for the high performance nMOS and pMOS (4.0 eV for nMOS, 5.2 eV for pMOS) was obtained. Further, as the adhesion between Ni and SiO$_2$ gate insulating films is very weak especially where the Ni content is 40 atom % or more, coming-off frequently occurred on the silicided layer/insulating film interface. Moreover, when the Ni content is 40 atom % or more, a compressive stress on the gate insulating film attributable to the silicided layer works on the insulating film, causing a drop in the reliability of the gate insulating film.

Figure 10:
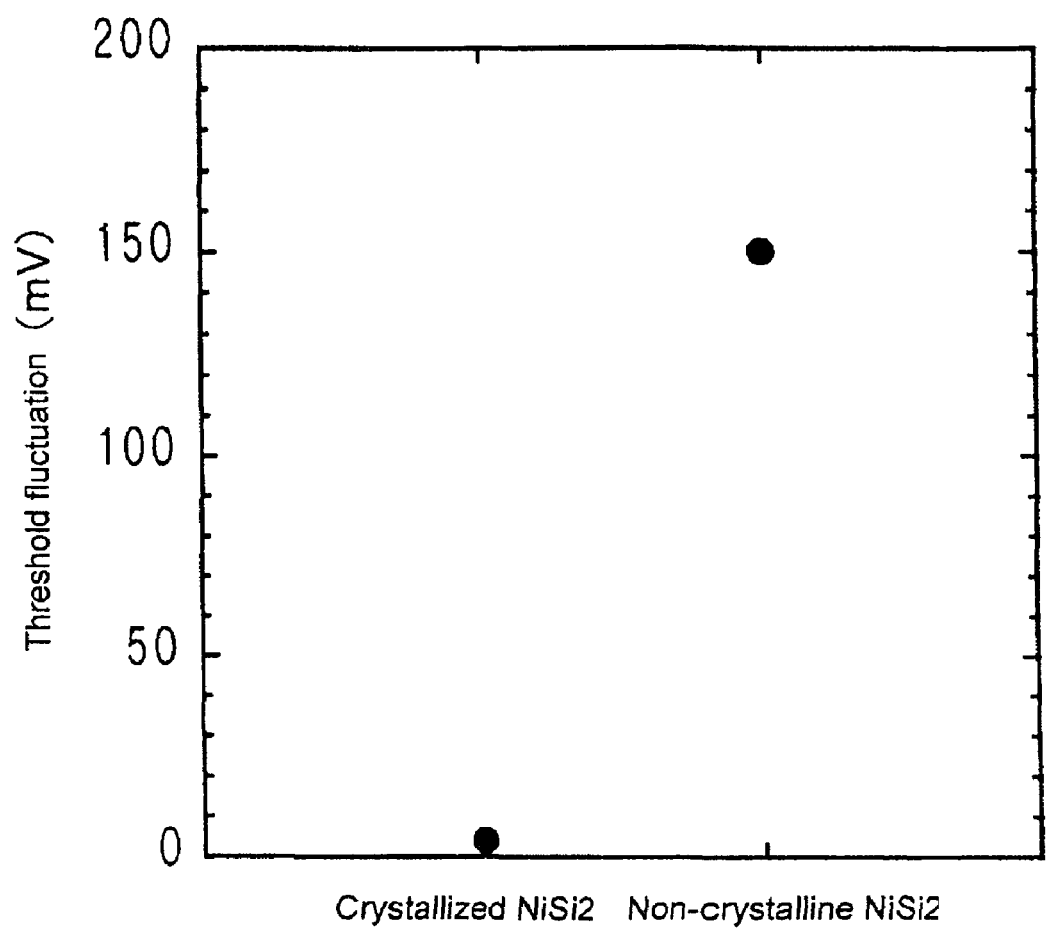
FIG. 10 is a diagram showing the unevenness of the thresholds of transistors fabricated according to the invention and the related art (comparative example)

Further, as the doped silicided layer formed by the method described in Patent Document 2 is not an Ni silicide of a stoichiometric composition as is stated in Patent Document 2 itself, the heat treatment after the formation causes the content distribution in the layer to vary, resulting in an observation that the effective work function significantly fluctuated. FIG. 10 shows the fluctuation of the thresholds of transistors using doped crystallized NiSi formed according to the invention, as the gate electrodes, and also shows the fluctuation of the thresholds of transistors using doped Ni silicided layer (the Ni content was 33.3%, the same as NiSi$_2$) formed by the method described in Patent Document 2, as the gate electrodes. In the case according to the embodiment of the invention, the absolute quantity of the fluctuation was 4 mV. In the case according to Patent Document 2, the absolute quantity of the fluctuation was 150 mV.

SECOND EXEMPLARY EMBODIMENT

FIGS. 11(a) through 11(h), FIGS. 12(i) through 12(k) and FIGS. 13(l) through 13(n) are sectional views showing a MOSFET manufacturing process according to a second exemplary embodiment of the invention.

In this exemplary embodiment, the following steps are included: forming a silicide layer in the source-drain diffusion region after the silicidation for gate electrode formation; and forming a silicon nitride film to distort the channel of the MOSFET, thereby enhancing electron mobility.

Figure 11:
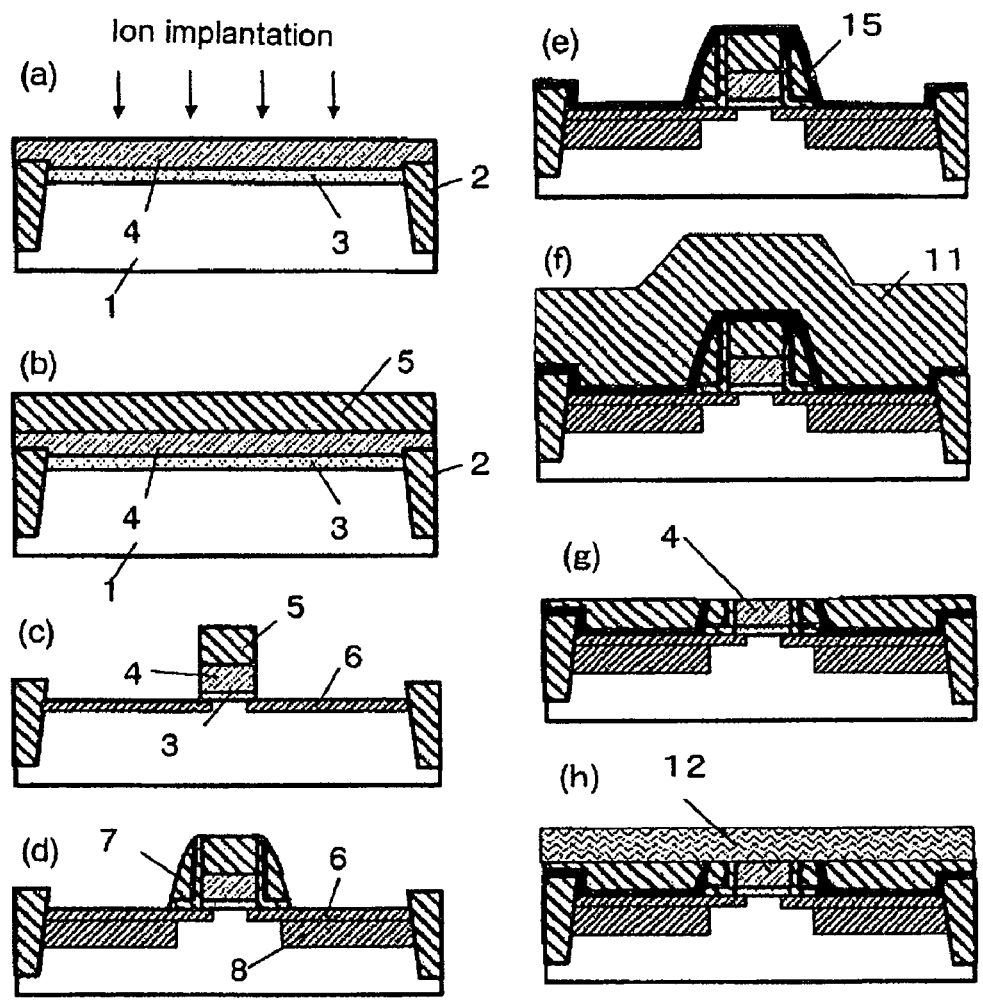
FIG. 11 are sectional views of steps of a semiconductor device manufacturing method in accordance with a second exemplary embodiment of the invention.

As the steps until the source-drain diffusion region formation (FIGS. 11(a) through 11(d)) are similar to their counterparts in the first exemplary embodiment (FIGS. 6(a) through 6(d)), their description will be dispensed with, and the description will refer to the next step (FIG. 11(e)) onward. Incidentally in this exemplary embodiment, Sb was added to the poly-Si film in the nMOS region, and In, to the poly-Si film in the pMOS region.

A silicon nitride film 15 was formed all over by the CVD method as shown in FIG. 11(e). This nitride film has the role of protecting the substrate and the like when the interlayer insulating film 11 is removed by wet processing afterwards.

Next, the interlayer insulating film 11 made up of a silicon oxide film was formed by the CVD method as shown in FIG. 11(f).

This interlayer insulating film 11 was flattened by the CMP technique, and then the poly-Si film 4 of the gate electrode pattern was exposed by etching back the interlayer insulating film as shown in FIG. 11(g).

Next, as shown in FIG. 11(h), the Ni film 12 for siliciding the poly-Si film 4 of the gate electrode pattern was deposited. The Ni film thickness at this step is to be so set that, when poly-Si and Ni sufficiently react with each other to form a silicide, the composition of part in contact with the gate insulating film become NiSi$_2$. In this exemplary embodiment, an Ni film of 25 nm was formed by DC magnetron sputtering at room temperature.

Figure 12:
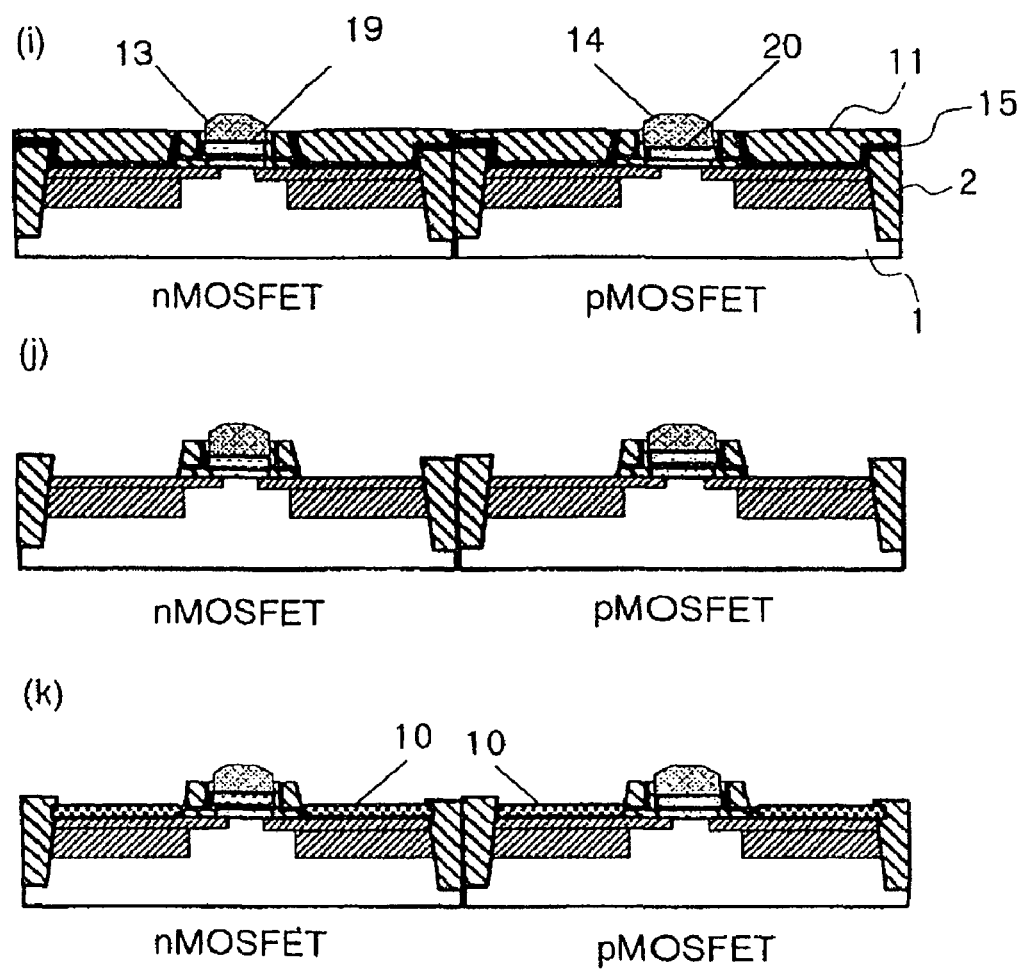
FIG. 12 are sectional views of steps of the semiconductor device manufacturing method in accordance with the second exemplary embodiment of the invention.

After that, crystallized NiSi$_2$ electrodes 13 and 14 were formed by causing poly-Si and Ni to sufficiently react with each other by heat treatment at 650° C. for two minutes. In this silicidation, the dopant (Sb) in the silicide electrode of the nMOS region segregated in the vicinities of the electrode/insulating film interface as shown in FIG. 12(i) to form a laminar segregated impurities region 19. The dopant (In) in the silicide electrode of the pMOS region also segregated in the vicinities of the electrode/insulating film interface as shown in FIG. 12(i) to form a laminar segregated impurities region 20.

After that, the superfluous Ni film which was not silicided at the heat treatment step was removed by wet etching.

Next, as shown in FIG. 12(j), the interlayer insulating film 11 was removed with an aqueous solution of hydrofluoric acid, followed by the removal of the silicon nitride film 15 with phosphoric acid.

Next, a metal film of 20 nm in thickness was deposited all over by sputtering, and the silicide layer 10 of about 40 nm in thickness was formed solely in the source-drain diffusion region by the salicide technique using the gate electrode, the gate side wall and the element separation region as masks (FIG. 12(k)). As this silicide layer 10, an Ni monosilicide (NiSi) layer that could minimize the contact resistance was formed. Instead of such an Ni silicide, a Co silicide or a Ti silicide may as well be used.

Figure 13:
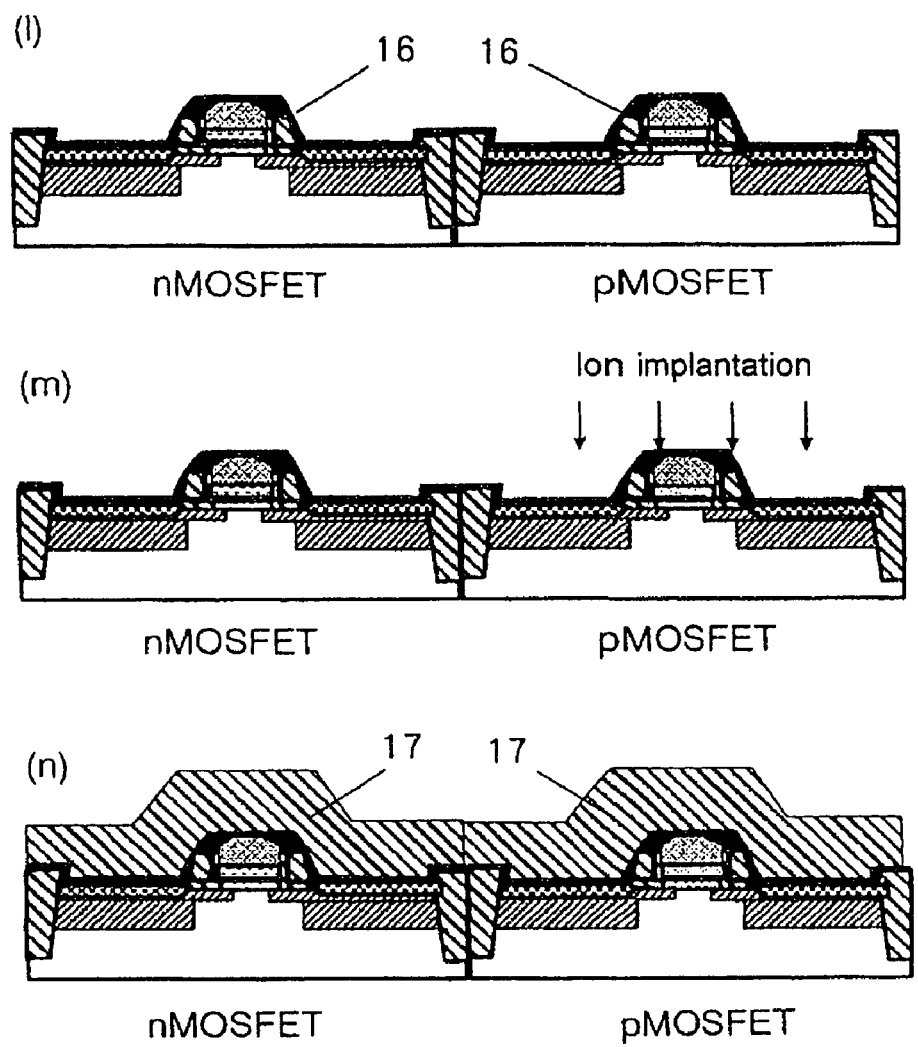
FIG. 13 are sectional views of steps of the semiconductor device manufacturing method in accordance with the second exemplary embodiment of the invention.

Next, as shown in FIG. 13(l), a silicon nitride film 16 was formed all over by the CVD method, in order to apply a tensile stress to the n-type channel, thereby enhancing electron mobility.

Next, as shown in FIG. 13(m), the silicon nitride film 16 over the pMOS region was subjected to ion implantation by carrying out ion implantation in combination with a usual PR process using a resist, and the stress on the silicon nitride film 16 was thereby eased.

Next, as shown in FIG. 13(n), an interlayer insulating film 17 of silicon oxide film was formed by the CVD method.

Finally, a contact plug and upper layer wiring (not shown) by usual methods were formed, and thus a CMOS structure having full silicide gate electrodes 13 and 14 in which impurity elements differing between the nMOS region and the pMOS region are segregated in the vicinities of the electrode/insulating film interface was obtained. In the MOSFET fabricated in this way, the effective work function of the full silicide electrode 13 was 4.0 eV for nMOS and 5.2 eV for pMOS.

In this exemplary embodiment too, as in the first exemplary embodiment, Vth is 0.1 V for nMOS and −0.1 V for pMOS as predicted from the effective work function. It was further confirmed that the electron mobility in this transistor could have a comparable value to that of a transistor using poly-Si for the gate electrode and SiO$_2$ for the gate insulating film.

Incidentally, even when other p-type impurities (B, Al, Ga, TI) than In were added to the Ni full silicide electrode for pMOS and other n-type impurities (N, P, As, Bi) than Sb were added to the Ni full silicide electrode for nMOS, similar effects were achieved.

As hitherto described, excellent transistor performance characteristics can be achieved by combining a crystallized Ni full silicide electrode (NiSi$_2$ electrode) to which impurity elements have been added and an SiON gate insulating film.

THIRD EXEMPLARY EMBODIMENT

FIGS. 15(a) through 15(d) are sectional views showing a MOSFET manufacturing process according to a third exemplary embodiment of the invention. This exemplary embodiment includes, with a view to realizing a lower threshold, a step of ion-implanting fluorine into the silicon substrate of the pMOS region where the p-channel is to be formed and nitrogen into the silicon substrate of the nMOS region where the n-channel is to be formed.

Figure 15:
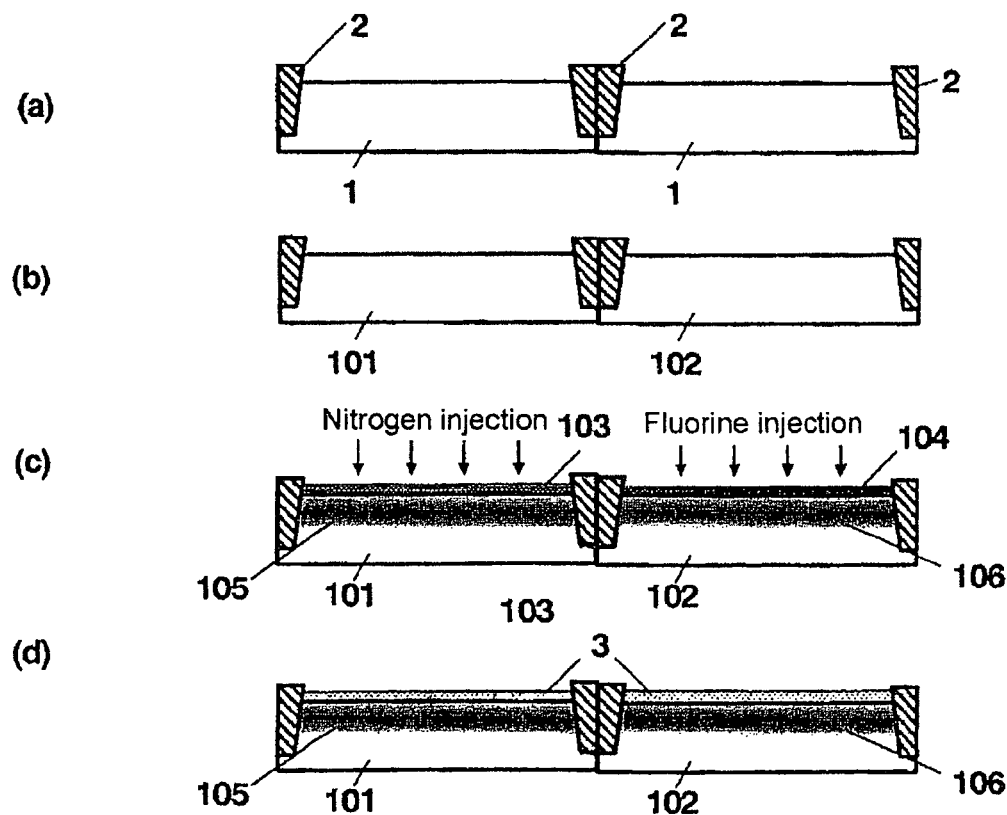
FIG. 15 are sectional views of steps of a semiconductor device manufacturing method in accordance with a third exemplary embodiment of the invention.

First, as shown in FIG. 15(a), the element separation region 2 was formed in the surface region of the silicon substrate 1 by applying the STI (Shallow Trench Isolation) technique.

Then, as shown in FIG. 15(b), an nMOS region 101 and a pMOS region 102 were formed in the element-separated silicon substrate surface by using the usual lithography step and ion implantation. The impurity concentration in the substrate forming the channel was set to between about $5 \times 10^{17}$ and $10^{18}$ cm$^{-3}$ to restrain device deterioration due to the short-channel effect in the minute MOSFET.

Next, as shown in FIG. 15(c), sacrificial oxide films 103 and 104 of respectively about 16 nm and 3 nm in thickness were formed over the surfaces of the nMOS region 101 and the pMOS region 102.

After that, by using a usual lithography step and ion implantation in a state in which one of the regions is masked, nitrogen was ion-implanted into the nMOS region 101 and fluorine, into the pMOS region 102 of the silicon substrate from over the sacrificial oxide films 103 and 104. The implantation energy and doses were, for instance, 15 KeV and $1 \times 10^{15}$ cm$^{-2}$, respectively for both fluorine and nitrogen. The quantities of nitrogen 105 and fluorine 106 immediately underneath the sacrificial oxide films 103 and 104 were assayed by the SIMS method, and found to be both about $1 \times 10^{20}$ cm$^{-3}$.

Next, heat treatment was performed at 900° C. for about 10 seconds, followed by removal of the sacrificial oxide films 103 and 104 with a solution of hydrofluoric acid.

Then, as shown in FIG. 15(d), an SiO$_2$ gate insulating film 3 of 1.8 nm in thickness was formed.

Figure 16:
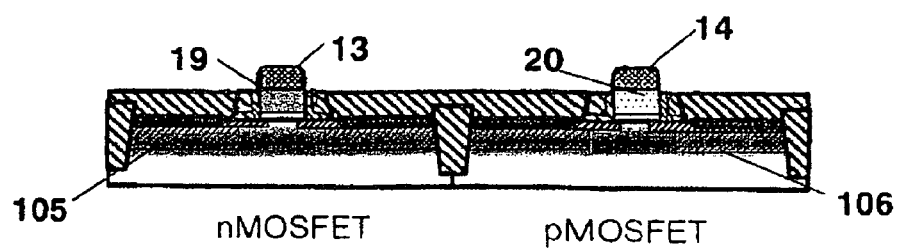
FIG. 16 is a schematic sectional view illustrating a semiconductor device in accordance with the third exemplary embodiment of the invention.

After the formation of the gate insulating film 3, a similar process to the MOSFET manufacturing process pertaining to the first exemplary embodiment was carried to form a CMOS shown in FIG. 16. This CMOS has NiSi$_2$ full silicide gate electrodes 13 and 14 that have, in the vicinities of the gate electrode/insulating film interface, segregated impurity regions in which the dopant elements differing between pMOS and nMOS (an n-type impurity 19 such as As for the nMOS region and a p-type impurity 20 such as B for the pMOS region) are segregated, and the CMOS further has the fluorine 106 in the p-channel region and the nitrogen 105 in the n-channel region. The quantities of the nitrogen 105 and the fluorine 106 in the silicon substrate immediately underneath the SiO$_2$ gate insulating film 3 in the fabricated MOSFET were assayed by the SIMS method, and found to be about $1 \times 10^{19}$ cm$^{-3}$ and $1 \times 10^{17}$ cm$^{-3}$, respectively.

Figure 17:
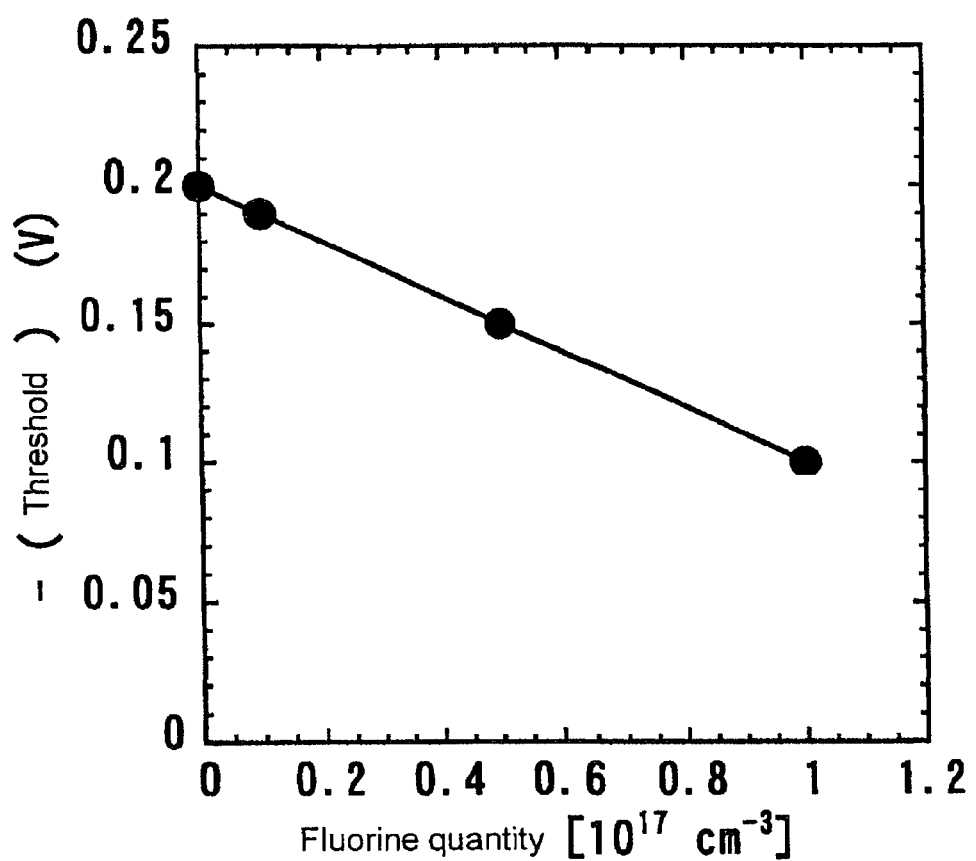
FIG. 17 is a diagram illustrating the range of thresholds of transistors that are fabricated according to the third exemplary embodiment of the invention (fluorine added)

FIG. 17 shows the threshold of pMOS in the MOSFET fabricated as described above when the quantity of fluorine in the silicon substrate after the MOSFET formation is varied by varying the implantation quantity of fluorine. The absolute value of the threshold drops with an increase in the quantity of fluorine, reaching about 0.1 V at a fluorine quantity of about $1 \times 10^{17}$ cm$^{-3}$. As is seen from FIG. 17, from the viewpoint of substantially varying the threshold, it is preferable for the quantity of fluorine in the channel immediately underneath the gate insulating film to be $1 \times 10^{16}$ cm$^{-3}$ or more, more preferable to be $5 \times 10^{16}$ cm$^{-3}$ or more. On the other hand, if the quantity of fluorine surpasses $2 \times 10^{17}$ cm$^{-3}$, the junction leak in the source-drain region tends to increase on account of crystalline defect formation accompanying ion implantation. Further, if the quantity of fluorine surpasses $5 \times 10^{17}$ cm$^{-3}$, accelerated oxidation is promoted, resulting in a tendency to make difficult the control of the gate insulating film of 2 nm or less in thickness required for the formation of a minute CMOS device. Therefore, from the viewpoint of restraining accelerated oxidation and crystalline defect formation accompanying ion implantation, it is preferable for the quantity of fluorine in the channel immediately underneath the gate insulating film to be $5 \times 10^{17}$ cm$^{-3}$ or less, more preferable to be $2 \times 10^{17}$ cm$^{-3}$ or less.

Figure 18:
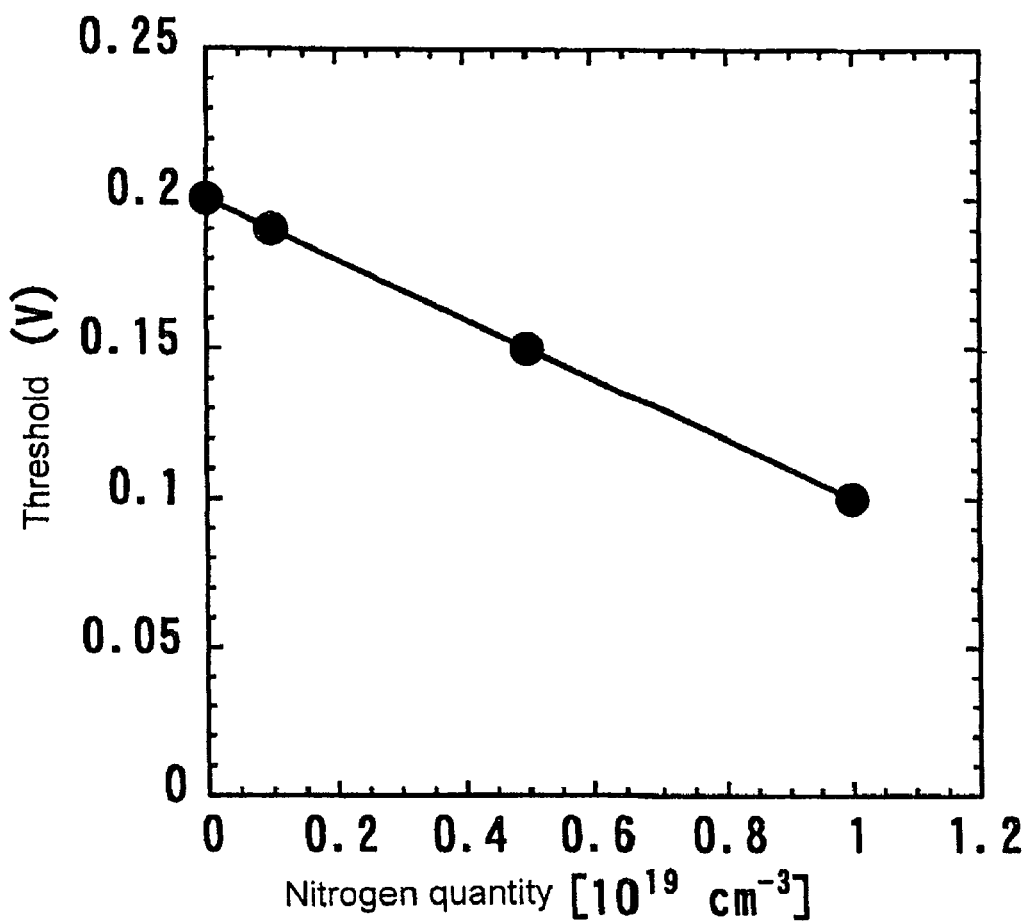
FIG. 18 is a diagram illustrating the range of thresholds of transistors that are fabricated according to the third exemplary embodiment of the invention (nitrogen added).

FIG. 18 shows the threshold of nMOS in the MOSFET fabricated as described above when the quantity of nitrogen in the silicon substrate after the MOSFET formation is varied by varying the implantation quantity of nitrogen. The threshold drops with an increase in the quantity of nitrogen, reaching about 0.1 V at a nitrogen quantity of about $1 \times 10^{19}$ cm$^{-3}$. As is seen from FIG. 18, from the viewpoint of substantially varying the threshold, it is preferable for the quantity of nitrogen in the channel immediately underneath the gate insulating film to be $1 \times 10^{18}$ cm$^{-3}$ or more, more preferable to be $5 \times 10^{18}$ cm$^{-3}$ or more. On the other hand, if the quantity of nitrogen is too great, especially if it surpasses $1 \times 10^{20}$ cm$^{-3}$, the reliability of the gate insulating film tends to deteriorate. Therefore, from the viewpoint of restraining the deterioration of the reliability of the gate insulating film, it is preferable for the quantity of nitrogen in the channel immediately underneath the gate insulating film to be $1 \times 10^{20}$ cm$^{-3}$ or less, more preferable to be $5 \times 10^{19}$ cm$^{-3}$ or less.

As indicated with reference to this exemplary embodiment, by combining a gate electrode made up of a crystallized Ni full silicide substantially having an NiSi$_2$ composition to which impurities have been added and a silicon substrate having a region containing fluorine or nitrogen in the vicinities of the gate insulating film/silicon substrate interface, a CMOS device whose threshold is much lower than that of the first exemplary embodiment can be obtained.

Although exemplary embodiments of the present invention have been described so far, the invention is not limited to these exemplary embodiments, but can be implemented by appropriately selecting materials and structure without deviating from the spirit thereof.

Figure 14:
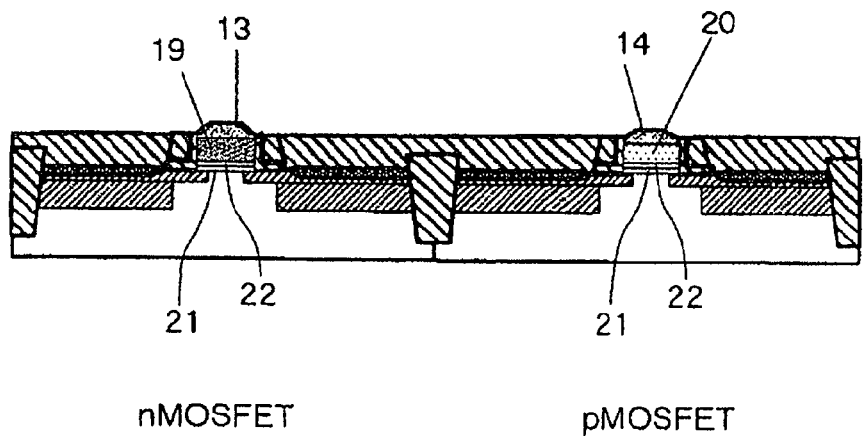
FIG. 14 is a schematic sectional view illustrating a semiconductor device in accordance with another exemplary embodiment of the invention.

For instance, if it is desired to reduce the gate leak current, a so-called high dielectric constant insulating film such as HfSiON can be used as the gate insulating film. In this case, the threshold variation would be less than in cases where a silicon oxide film or a silicon oxynitride film is used. However, as shown in FIG. 14, by placing a silicon oxide film, silicon a oxynitride film or a silicon nitride film as a cap film 22 intervening between the gate electrode and the high dielectric constant insulating film 21, the effective work function can be reduced with the result of realizing a low threshold. Between the high dielectric constant insulating film and the substrate, a silicon oxide film or a silicon oxynitride film may as well be provided.

Incidentally in this specification, the "effective work function" of the gate electrode is usually figured out from a flat band by CV measurement, and is influenced by a fixed charge in the insulating film, a dipole formed on the interface, a Fermi level pinning and so forth besides the gate electrode's own work function. It is distinguished from the essential "work function" of the material making up the gate electrode. Further, the term "high dielectric constant insulating film" is used to distinguish it from the insulating film made up of silicon dioxide (SiO$_2$) conventionally used as the gate insulating film, and means that it has a higher dielectric constant than that of silicon dioxide, but its specific value is not limited by this term.

The invention claimed is:

1. A semiconductor device, comprising:
   a silicon substrate; and
   a field effect transistor comprising a gate insulating film over the silicon substrate, a gate electrode on the gate insulating film, and source and drain regions,
   wherein said gate electrode comprises, at least in part in contact with said gate insulating film, a first silicide region having an NiSi2 phase and containing a p-type impurity element and a second silicide region having an NiSi phase disposed above the first silicide region;
   the silicide making up said crystallized Ni silicide region is of a composition represented by Ni$_x$Si$_{1-x}$($0.2 \leq x < 0.4$); and
   said gate insulating film comprises a silicon oxide film, a silicon oxynitride film or a silicon nitride film, the silicon oxide film, the silicon oxynitride film or the silicon nitride film being in contact with said crystallized Ni silicide region of the gate electrode.

2. The semiconductor device according to claim 1, wherein the gate insulating film further comprises a high dielectric constant insulating film under the silicon oxide film, the silicon oxynitride film or the silicon nitride film.

3. The semiconductor device according to claim 1, wherein the silicide making up said crystallized Ni silicide region comprises an NiSi$_2$ phase.

4. The semiconductor device according to claim 1, wherein said silicon substrate comprises, at least in part in contact with the gate insulating film, a region containing fluorine atoms in the case of a P-channel transistor and a region containing nitrogen atoms in the case of an N-channel transistor.

5. A semiconductor device, comprising:
   a silicon substrate;
   a P-channel field effect transistor comprising a first gate insulating film over said silicon substrate, a first gate electrode on the first gate insulating film, and first source and drain regions; and
   an N-channel field effect transistor comprising a second gate insulating film over said silicon substrate, a second gate electrode on the second gate insulating film, and second source and drain regions,
   wherein the first gate electrode comprises, at least in part in contact with the first gate insulating film, a crystallized Ni silicide region containing p-type impurities;
   the second gate electrode comprises, at least in part in contact with the second gate insulating film, a crystallized Ni silicide region containing n-type impurities;
   at least one of the crystallized Ni silicide regions of the first and second gate electrodes includes a first silicide region having an NiSi2 phase and a second silicide region having an NiSi phase disposed above the first silicide region;
   the silicides making up the crystallized Ni silicide regions of the first and second gate electrodes are of a composition represented by Ni$_x$Si$_{1-x}$($0.2 \leq x < 0.4$);
   the first gate insulating film comprises a silicon oxide film, a silicon oxynitride film or a silicon nitride film, the silicon oxide film, the silicon oxynitride film or the silicon nitride film being in contact with the crystallized Ni silicide region of the first gate electrode; and
   the second gate insulating film comprises a silicon oxide film, a silicon oxynitride film or a silicon nitride film, the silicon oxide film, the silicon oxynitride film or the silicon nitride film being in contact with the crystallized Ni silicide region of the second gate electrode.

6. The semiconductor device according to claim 5, wherein the first gate insulating film further comprises a high dielectric constant insulating film under the silicon oxide film, the silicon oxynitride film or the silicon nitride film, and the second gate insulating film further comprises a high dielectric constant insulating film under the silicon oxide film, the silicon oxynitride film or the silicon nitride film.

7. The semiconductor device according to claim 5, wherein the silicides making up the crystallized Ni silicide regions of the first and second gate electrodes comprises NiSi$_2$ phases.

8. The semiconductor device according to claim 5, wherein the first and second gate electrodes comprise, in respective parts in contact with the first and second gate insulating films, a high concentrated-impurity region containing an impurity element of a higher concentration than an upper region above the high concentrated-impurity region.

9. The semiconductor device according to claim 5, wherein the first and second gate electrodes comprise, in respective parts in contact with the first and second gate insulating films, a region having impurity concentration of $1 \times 10^{20}$ cm$^{-3}$ or above.

10. The semiconductor device according to claim 5, wherein the first and second gate insulating films are silicon oxide films or silicon oxynitride films.

11. The semiconductor device according to claim 5, wherein said silicon substrate comprises, at least in part in contact with the first gate insulating film, a region containing fluorine atoms.

12. The semiconductor device according to claim 5, wherein said silicon substrate comprises, at least in part in contact with the second gate insulating film, a region containing nitrogen atoms.

13. A method of manufacturing the semiconductor device as recited in claim 5, comprising:
  providing a silicon substrate comprising an n-type active region and a p-type active region;
  forming a insulating film for first and second gate insulating films over said silicon substrate;
  forming a silicon film for gate over said insulating film;
  adding p-type impurities to said silicon film for gate in a region where a P-channel field effect transistor is to be formed;
  adding n-type impurities to said silicon film for gate in a region where an N-channel field effect transistor is to be formed;
  forming a gate pattern by processing said silicon film for gate;
  forming first source and drain regions in the region where the P-channel field effect transistor is to be formed;
  forming second source and drain regions in the region where the N-channel field effect transistor is to be formed;
  forming an interlayer insulating film so as to cover said gate pattern;
  removing upper part of the interlayer insulating film so as to expose said gate pattern;
  forming a nickel film over the exposed gate pattern;
  conducting heat treatment to silicide said gate pattern, thereby forming first and second gate electrodes; and
  selectively removing superfluous nickel of unsilicided part of said nickel film.

14. The method according to claim 13, wherein the p-type impurities and the n-type impurities are added by ion implantation.

15. The method according to claim 13, further comprising: adding fluorine to the silicon substrate in the region where the P-channel field effect transistor is to be formed before forming the insulating film for the first and second gate insulating films.

16. The method according to claim 13, further comprising: adding nitrogen to the silicon substrate in the region where the N-channel field effect transistor is to be formed before forming the insulating film for the first and second gate insulating films.

17. The method according to claim 15, further comprising: adding nitrogen to the silicon substrate in the region where the N-channel field effect transistor is to be formed before forming the insulating film for the first and second gate insulating films.

18. The semiconductor device according to claim 11, wherein said silicon substrate comprises, at least in part in contact with the second gate insulating film, a region containing nitrogen atoms.

19. The semiconductor device according to claim 1, wherein the gate electrode comprises, in a part in contact with the gate insulating film, a high concentrated-impurity region containing an impurity element of a higher concentration than an upper region above the high concentrated-impurity region.

20. The semiconductor device according to claim 19, wherein the high concentrated-impurity region has impurity concentration of $1 \times 10^{20}$ cm$^{-3}$ or above.

21. The semiconductor device according to claim 8, wherein the high concentrated-impurity region has impurity concentration of $1 \times 10^{20}$ cm$^{-3}$ or above.

22. A semiconductor device, comprising:
  a silicon substrate; and
  a field effect transistor comprising a gate insulating film over the silicon substrate, a gate electrode on the gate insulating film, and source and drain regions,
  wherein said gate electrode comprises, at least in part in contact with said gate insulating film, a crystallized Ni silicide region containing an impurity element of a conductivity type opposite to a conductivity type of a channel region in the field effect transistor,
  the silicide making up said crystallized Ni silicide region is of a composition represented by Ni$_x$Si$_{1-x}$ ($0.2 \leqq x < 0.4$),
  said gate insulating film comprises a silicon oxide film, a silicon oxynitride film or a silicon nitride film, the silicon oxide film, the silicon oxynitride film or the silicon nitride film being in contact with said crystallized Ni silicide region of the gate electrode, and
  the gate electrode comprises a first silicide region comprising an NiSi$_2$ phase, the first silicide region being in contact with the gate insulating film, and a second silicide region comprising an NiSi phase, the second silicide region being above the first silicide region.

23. A semiconductor device, comprising:
  a silicon substrate;
  a P-channel field effect transistor comprising a first gate insulating film over said silicon substrate, a first gate electrode on the first gate insulating film, and first source and drain regions; and
  an N-channel field effect transistor comprising a second gate insulating film over said silicon substrate, a second gate electrode on the second gate insulating film, and second source and drain regions,
  wherein the first gate electrode comprises, at least in part in contact with the first gate insulating film, a crystallized Ni silicide region containing p-type impurities,
  the second gate electrode comprises, at least in part in contact with the second gate insulating film, a crystallized Ni silicide region containing n-type impurities, the silicides making up the crystallized Ni silicide regions of the first and second gate electrodes are of a composition represented by $Ni_xSi_{1-x}(0.2 \leqq x < 0.4)$, the first gate insulating film comprises a silicon oxide film, a silicon oxynitride film or a silicon nitride film, the silicon oxide film, the silicon oxynitride film or the silicon nitride film being in contact with the crystallized Ni silicide region of the first gate electrode, the second gate insulating film comprises a silicon oxide film, a silicon oxynitride film or a silicon nitride film, the silicon oxide film, the silicon oxynitride film or the silicon nitride film being in contact with the crystallized Ni silicide region of the second gate electrode, and the first and second gate electrodes each comprise a first silicide region comprising an $NiSi_2$ phase, the first silicide region being in contact with the first or second gate insulating film, and a second silicide region comprising an NiSi phase, the second silicide region being above the first silicide region.

24. The semiconductor device according to claim 1, further comprising an n-type well formed on a surface of the silicon substrate, wherein the gate insulating film is formed on the n-type well.

25. The semiconductor device according to claim 1, wherein the field effect transistor is a P-channel transistor.

* * * * *